United States Patent [19]

Moore

[11] Patent Number: 4,463,673

[45] Date of Patent: Aug. 7, 1984

[54] METHOD AND APPARATUS FOR REGISTRATION OF PLANAR MEMBERS AND THE LIKE THROUGH THE EMPLOYMENT OF AN INTERMEDIATE ALIGNMENT SHEET

[76] Inventor: Michael Moore, 1971 Old Cuthbert Rd., Cherry Hill, N.J. 08034

[21] Appl. No.: 300,449

[22] Filed: Sep. 8, 1981

[51] Int. Cl.$^3$ ................ B41M 1/12; B05C 17/06
[52] U.S. Cl. ................ 101/129; 101/DIG. 12; 101/126; 33/180 R; 29/720
[58] Field of Search ............ 101/34, 129, 128.4, 101/126, 127.1, 383–384, 114, 382 MV, DIG. 12; 33/227, 228, 276, 278, 286, 180 R; 29/833, 720, 721, 407

[56] References Cited

U.S. PATENT DOCUMENTS

| | | | |
|---|---|---|---|
| 2,963,964 | 12/1960 | Klump | 101/126 X |
| 3,221,648 | 12/1965 | Weiss | 101/126 |
| 3,656,232 | 4/1972 | Hinchey | 29/833 |
| 3,713,746 | 1/1973 | Luthy et al. | 33/286 |
| 3,857,337 | 12/1974 | Tsuji | 101/126 X |
| 3,943,851 | 3/1976 | Inada et al. | 101/127.1 |
| 3,957,371 | 5/1976 | Rich | 101/126 X |
| 3,964,385 | 6/1976 | Knight | 101/126 |
| 4,015,034 | 3/1977 | Smolen | 33/180 R |
| 4,210,077 | 7/1980 | Lindstrom | 101/126 |
| 4,315,461 | 2/1982 | Harpold | 101/126 |
| 4,356,223 | 10/1982 | Iida et al. | 33/286 |

FOREIGN PATENT DOCUMENTS 55-65557  5/1980  Japan .................... 101/129

OTHER PUBLICATIONS

"Image Alignment for Semiconductor Processing," IBM Tech. Discl. Bulletin, vol. 9, No. 11, Apr. 1967, pp. 1590–1591.
IBM Tech. Disclosure Bulletin "Fixture for Accurate Artwork Registration" vol. 21, No. 8, Jan. 1979, pp. 3192–3193.

Primary Examiner—E. H. Eickholt
Attorney, Agent, or Firm—Hubbell, Cohen, Stiefel & Gross

[57] ABSTRACT

A planar member is provided with locator surfaces arranged to cooperate with locator pins provided on the supporting surface of a registration apparatus. The planar member containing a pattern which is to be transferred is provided with a registration pattern. A holder supporting this member may be reciprocated to move this member toward or away from the first-mentioned planar member. Positioning means are provided for selectively moving the planar members relative to one another both orthogonally and rotationally. An alignment sheet containing locator surfaces identical to those of the first-mentioned planar member and a registration pattern complementary to that of the second mentioned planar member is positioned upon the supporting surface. The holder is moved downwardly to lower the second-mentioned planar member upon the supporting surface. The pins are retracted prior to such lowering. Electromagnetic radiation is then directed through the registration patterns of the alignment sheet and second planar member. The positioning means is manipulated until the complementary registration patterns are in registry, at which time substantially all of the radiation is blocked from passing through the combined sheet members. The holder is then raised, the alignment sheet is removed and the first-mentioned planar member is positioned upon the surface with its locator surfaces receiving the locator pins. The first and second planar members are then in precise registration, with no further alignment being required until a different pattern is to be printed.

42 Claims, 28 Drawing Figures

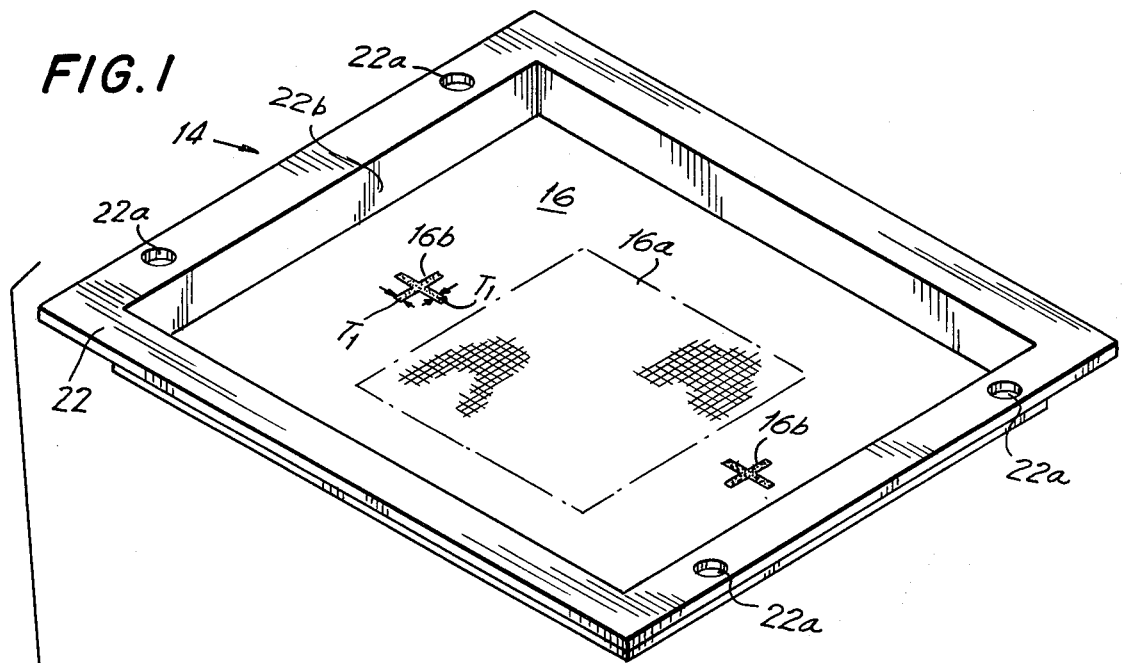
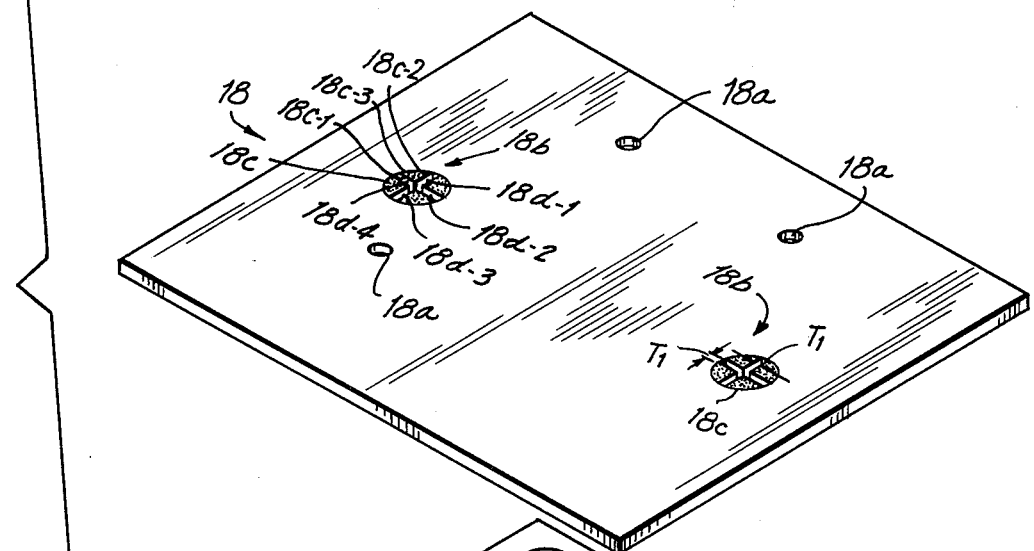
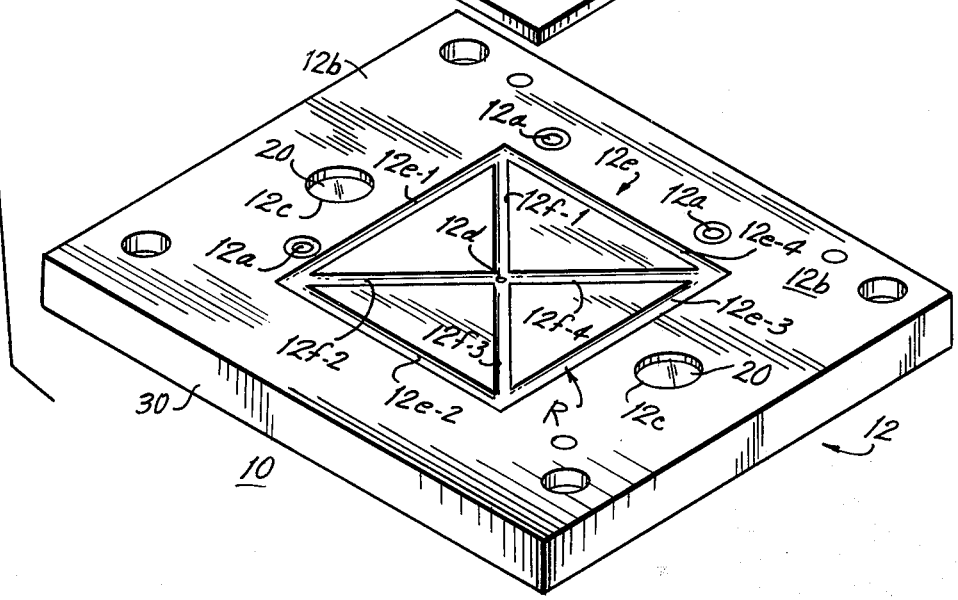
FIG. 1

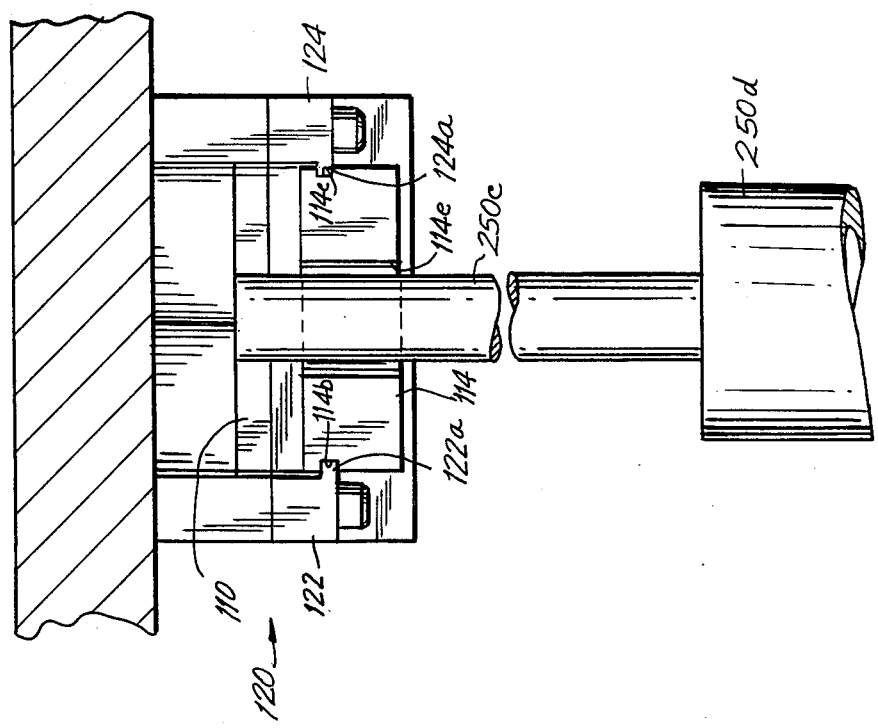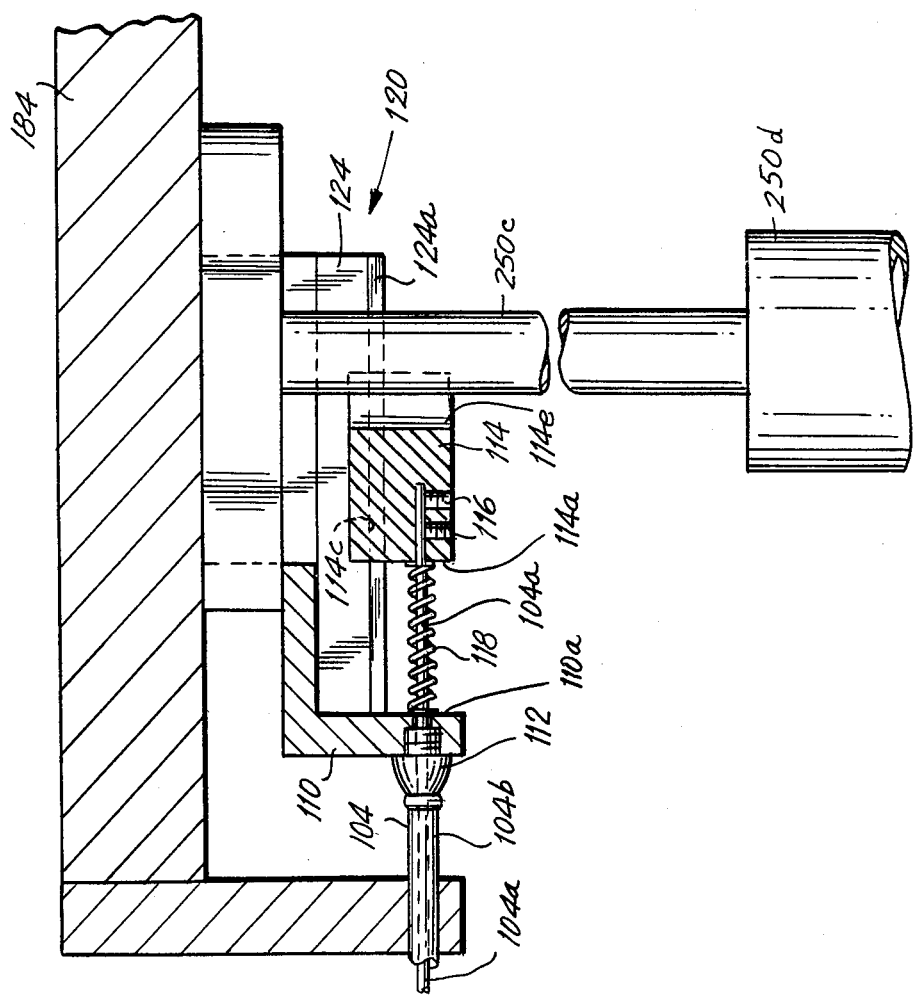

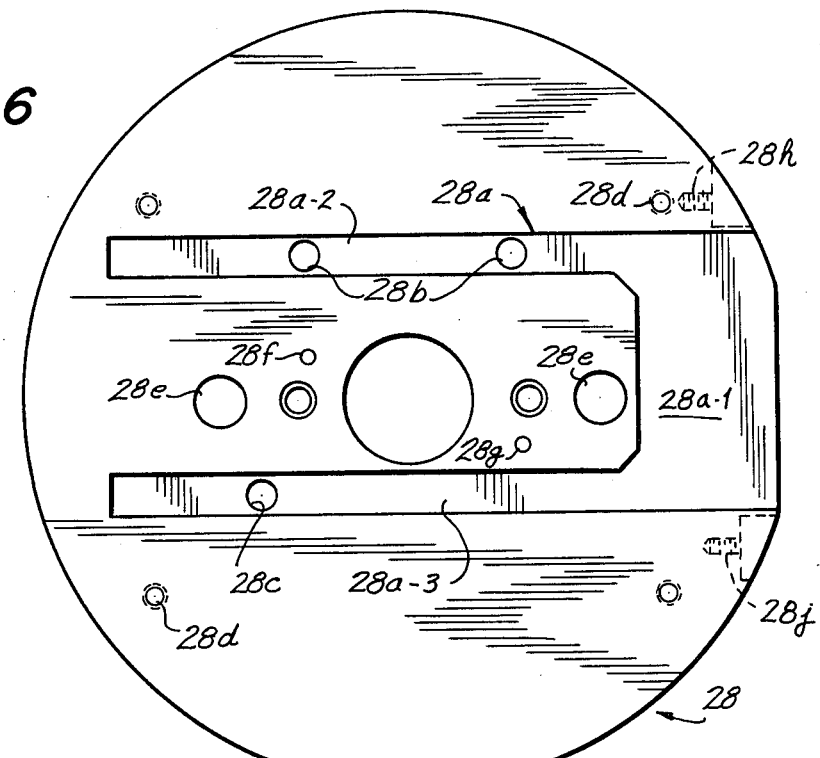
FIG.6
FIG.6a
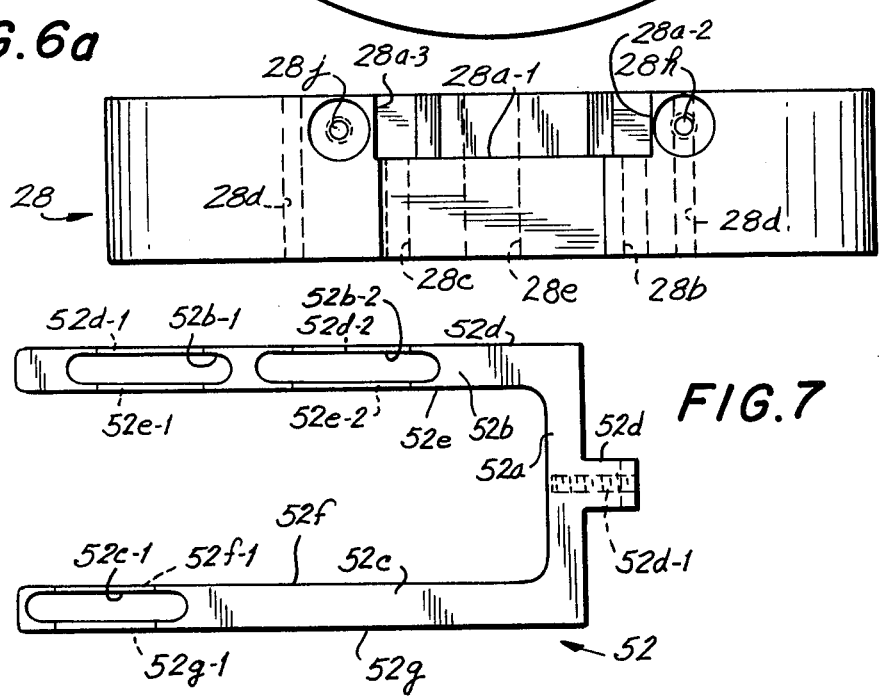
FIG.7
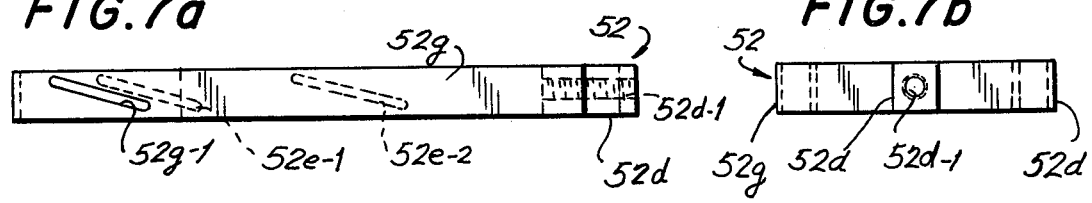
FIG.7a    FIG.7b

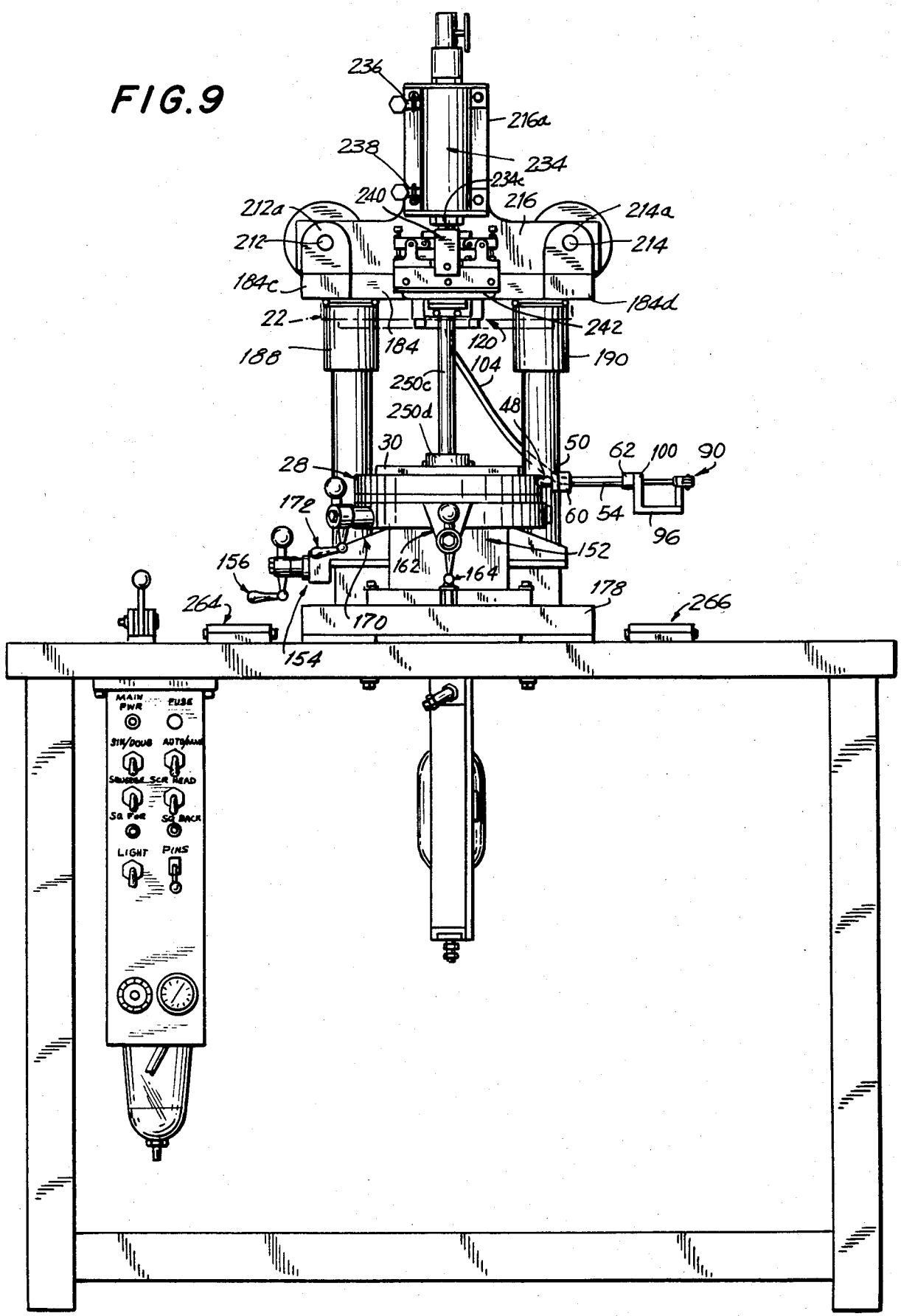

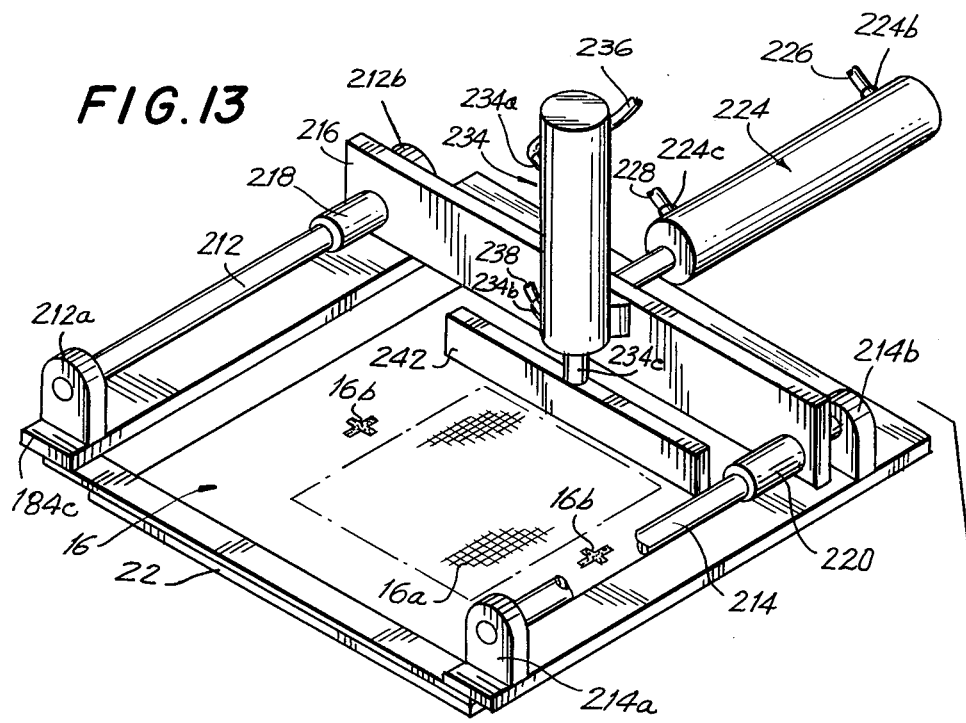
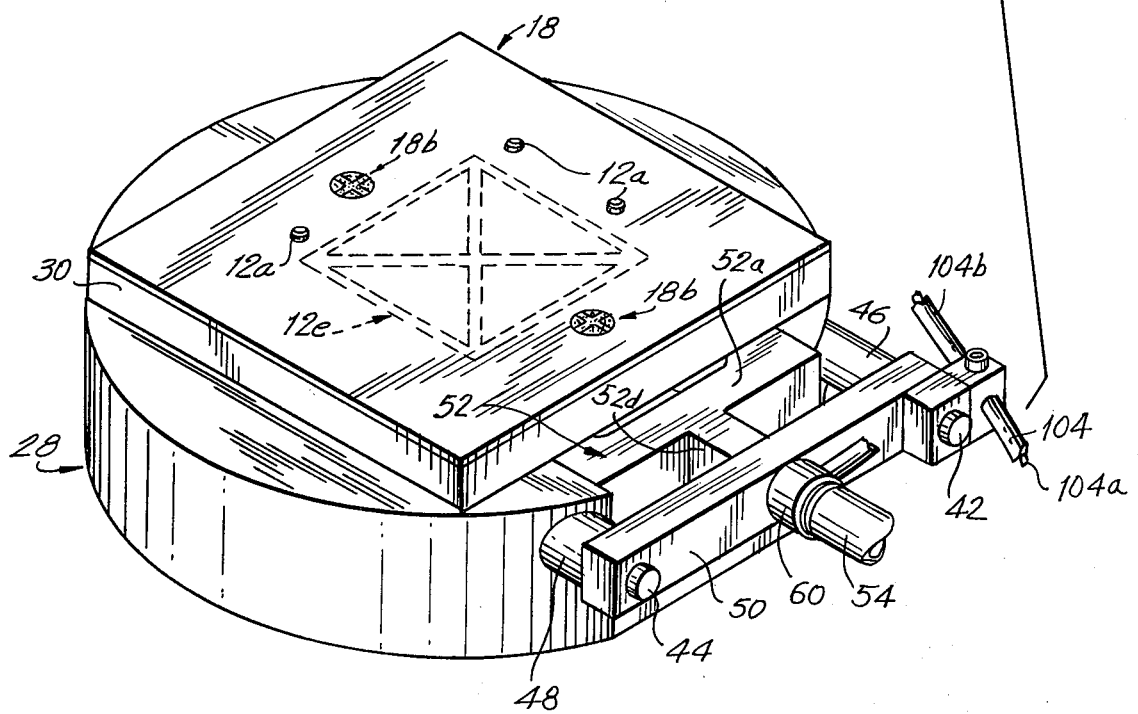
FIG.13

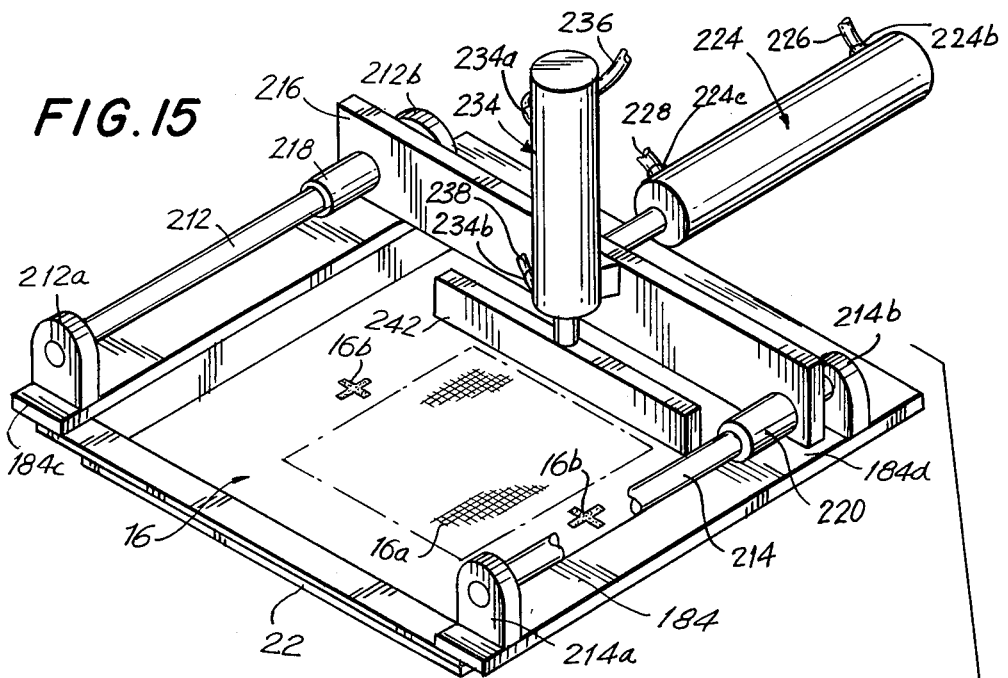
FIG.15
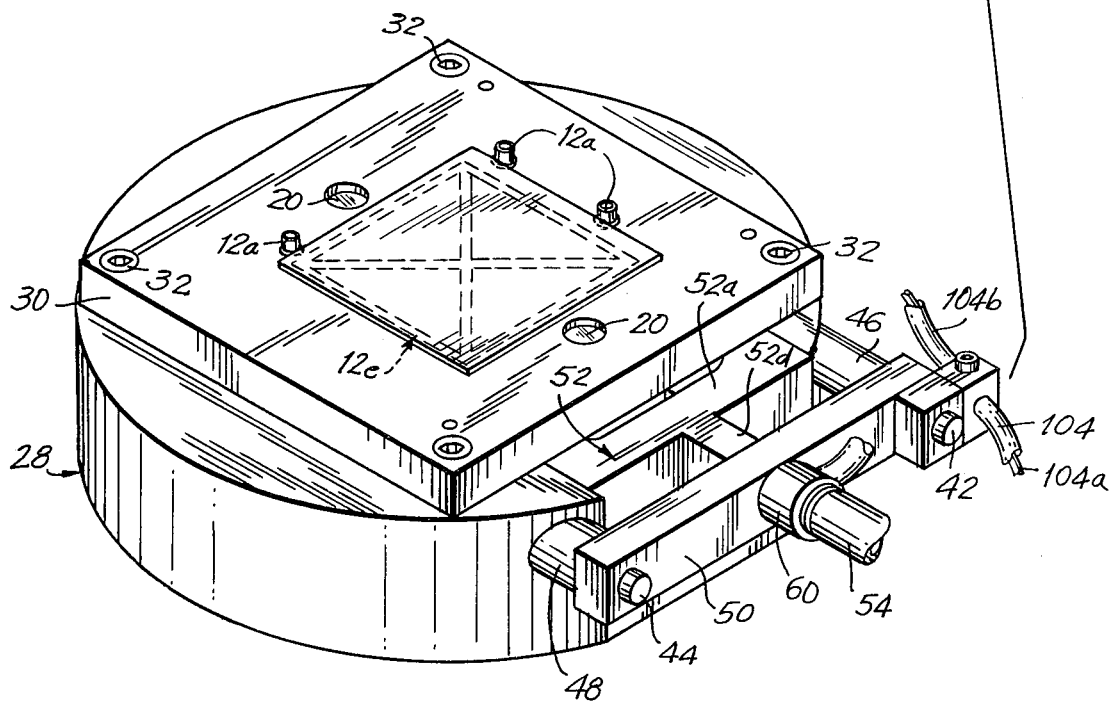

METHOD AND APPARATUS FOR REGISTRATION OF PLANAR MEMBERS AND THE LIKE THROUGH THE EMPLOYMENT OF AN INTERMEDIATE ALIGNMENT SHEET

TECHNICAL FIELD

The present invention is directed to method and apparatus for bringing a planar member containing a master pattern into registry with a planar member on which the pattern is to be transferred and more particularly, to novel method and apparatus for obtaining such registration through the medium of a novel alignment sheet.

BACKGROUND ART

Complex electronic devices such as, for example, printed circuits, integrated circuits and the like, are typically produced through photo etching or screen printing techniques. As one example, a printed circuit board comprised of an insulating substrate having a conductive sheet adhered to one of its major surfaces, is coated with photo-resist material. A mask is placed over the conductive sheet containing the photo-resist coating, and the mask and printed circuit board are exposed to light for a suitable time interval. The printed circuit board is then placed in a bath containing a suitable etchant. The regions of the photo-resist which have been exposed to light are immune to the etchant, whereas the remaining regions typically containing a conductive film, which have not been exposed to light are removed by the etchant, thereby forming a pattern which may be described as printed wiring, upon the insulating substrate. The remaining photo-resist material may then be removed by a suitable etchant.

Resistances or other active or passive electrical elements may be formed directly upon the printed circuit board or other electronic device through a technique employing screens provided with a pattern conforming to the desired resistance elements, said screen being positioned upon the printed wiring surface of the printed circuit board. A resistive ink is placed upon the screen and is transferred to the printed circuit board by operation of a squeegee which is moved across the surface of said screen to force the resistive solution through the screen in accordance with the aforementioned pattern provided therein. The reduced size and intricacy of the printed wiring pattern and the resistance elements printed thereon necessitates that the various patterns provided thereon be in absolute registration, which is conventionally achieved by providing registration patterns respectively on the screen and mask, on the one hand, and the printed circuit board on the other hand. The registration pattern which must be provided to assure precise registration must be printed or otherwise machined into the printed circuit board, necessitating the provision of additional steps in its fabrication and further reducing the area remaining for receipt of the printed wiring and resistor patterns. In addition, each time a printed wiring board is removed, another registration operation must be performed when a new printed wiring board is placed upon the registration apparatus, thereby reducing overall productivity.

DISCLOSURE OF THE INVENTION

The present invention is characterized by comprising method and apparatus for providing registration between planar members through the use of an independent alignment sheet having a registration pattern arranged to cooperate with the registration pattern on the planar member constituting the master sheet to achieve registration therebetween and having an arrangement of locater surfaces provided on the planar member constituting the workpiece (i.e. printed circuit board) which is to receive the desired pattern.

The apparatus utilized for obtaining precision registration comprises a support having a surface for receiving substrate or other suitable workpiece and having locator pins which, when raised above said surface, cooperate with the locator surfaces in the alignment sheet or the planar member to precisely align the member arranged thereon in a predetermined position. The support surface is further provided with vacuum means for holding the alignment sheet and/or workpiece (substrate) in the aligned position when the locator pins are lowered to a position beneath the surface of said support.

The holder is arranged to be reciprocated upon suitable vertically aligned guide rods to respectively raise the holder above the surface of the work table and to lower the holder in order to place the planar member (i.e. screen) mounted upon the holder upon the surface of the planar workpiece or alignment sheet positioned on said support surface. The planar member (for example, screen) is mounted upon the holder and the planar member and workpiece are movable relative to one another in an imaginary plane parallel to said support surface and in mutually perpendicular directions and are further rotationally movable relative to one another about an imaginary vertical axis in order to bring the registration pattern on said planar member in precise registry with the registration pattern of the alignment sheet arranged upon said support surface. This means for moving either the planar member (screen) or supporting surface preferably comprise conventional $XY\theta$ adjustment means utilizing servo mechanisms or manually operable means.

Drive means in the form of a pneumatic circuit is provided for raising and lowering the locator pins relative to said support surface. A mechanical safety device is arranged to move a slidable safety guide into blocking position relative to a vertically aligned member so that said safety slide engages a shoulder provided on said member as long as the locator pins are extended above the said support surface thereby preventing the planar member mounted on said holder from engaging and being damaged by said locator pins. The safety slide is withdrawn to a position displaced from the aforementioned shoulder on said member when the locator pins are safely lowered either flush with or beneath said support surface.

The aforementioned pneumatic circuit is further provided with pneumatic delay means in the form of an accumulator (i.e., a tank) interposed between the pneumatic lines respectively operating said locator pins to the raised position and said holder to its raised position, said accumulator serving to delay the lifting of said pins by diverting and accumulating air under pressure being delivered to the piston operating the locator pins at least until said holder has been raised to a position which is safely above the maximum height of the locator pins above said support surface.

The aforementioned registration patterns preferably take the form of a pair of registration patterns provided on each of the planar members mounted on said holder and said alignment sheet, the registration patterns on said alignment sheet being of a complementary nature relative to the registration patterns on said planar member mounted upon said holder so as to substantially block any light from passing through the first and second pairs of registration patterns when they are in perfect registry. In one preferred embodiment, the registration patterns provided in the planar member mounted upon said holder, comprise a substantially cross-shaped transparent region, while the complementary pattern in said alignment sheet comprises an opaque cross-shaped region which is substantially surrounded by four quadrants of a circle which quadrants are transparent. Registry is accomplished by moving the complementary registration patterns into alignment, the face of alignment being established when substantially all of the light directed from a light source aligned with said over-lying patterns is blocked from passing through said registration patterns. The support surface is provided with a pair of electromagnetic radiation generating sources (lamps) arranged beneath said support surface, which surface is provided with a pair of lenses arranged in said surface to facilitate the passage of electromagnetic radiation therethrough and toward the registration patterns being brought into alignment.

The aforesaid apparatus is provided with electrical circuit means for preventing further operation of said apparatus unless and until all of the steps of the procedure are properly accomplished and are performed in a predetermined order, thereby positively assuring both correct and safe operation of the apparatus. Sensing means in the form of switches are provided for halting operation in the apparatus in the event that certain components thereof have failed to move to desired control positions as a result of faulty operation of the means utilized for moving such members to the desired positions. For example, proximity type switch means are provided to prevent operation of squeegee means provided on said holder until said holder has been lowered to a position which places the planar member on said holder directly upon the planar members arranged on said support surface. The squeegee is prevented from moving across the printing screen until it is properly lowered on the screen and until the screen is properly lowered upon the workpiece.

As was mentioned hereinabove, the planar member arranged on said holder may be a screen, mask, photo negative, or any other planar member which is desired to be brought into registry with a workpiece arranged on said support surface.

In order to form a pattern on the planar member arranged on said support surface by means of an ink screening process, the holder is provided with a squeegee assembly which is adapted to be linearly moved across the top surface of the screen mounted on said holder. The aforesaid pneumatic circuit includes means for raising and lowering the squeegee relative to the upper surface of the screen only after the holder has been lowered upon the workpiece and means for moving the squeegee across the top surface of said screen only after the squeegee has been lowered to a position engaging said screen. The squeegee assembly is arranged to adjustably position the squeegee at a skewed angle relative to the direction of movement of the squeegee, as well as being adjustable to alter the pressure exerted by the squeegee upon said screen.

Manually operable controls are provided for preventing operation of the apparatus unless first and second independent control members are manually operated simultaneously, in order to significantly reduce, if not eliminate, the possible accidental operation of the apparatus. The preprogrammed arrangement of the electrical control circuitry prevents a continuation of subsequent program steps and automatically resets the apparatus to an initial condition in the event that certain program steps early in the procedure have not been performed in their proper order. To the contrary, the preprogramed arrangement of the electrical control circuit permits the remaining steps of the program to be performed in proper sequence without the need for any human intervention or assistance, so long as a predetermined number of procedural steps of the program have been performed. As an overall measure, override switch means are provided for halting the apparatus regardless of the procedural step being performed at the time that the override switch means is operated. Depression of the overriding switch means also returns the apparatus to the initial procedural step in readiness for the performance of a complete cycle of operation.

It is therefore one object of the present invention to provide novel method and apparatus for bringing planar members into registry through the employment of an alignment sheet.

Another object of the present invention is to provide a novel method and apparatus for bringing planar members into registry and utilizing an alignment sheet having a registration pattern complementary to the registration pattern provided on one of said planar members, registration of the alignment sheet and planar member being obtained when an alteration in passage of electromagnetic radiation through said registration patterns is obtained.

Still another object of the present invention is to provide novel method and apparatus for bring planar members into registration through the use of an alignment sheet having a registration pattern cooperating with the registration pattern on one of said planar members to assure registration therebetween and further provided with locator surfaces identical to locator surfaces provided on the remaining one of said planar members and cooperating with locator pins on a support provided therefore to automatically provide registration between said first and second planar members when said alignment sheet is removed from said surface and replaced by said second planar member.

Still another object of the present invention is to provide a novel apparatus for bringing first and second planar members into precise registration and comprising a support for supporting one of said planar members and a reciprocating movable holder for supporting the other of said planar members, said support having retractable locator pins and further including means for preventing lifting of said pins until said holder has been lifted a safe distance above said support surface.

Still another object of the present invention is to provide a novel method for assuring precise registration between first and second planar members in the employment of an alignment sheet wherein said first planar member is provided with a predetermined registration pattern, said alignment sheet is provided with a registration pattern complementary to that of said first planar member and is further provided with locator surfaces substantially identical to locator surfaces provided in said second planar member.

Still another object of the present invention is to provide a novel apparatus for bringing first and second planar members into precise registration and comprising electronic circuit control means for halting operation of said apparatus and returning said apparatus to an initial condition in the event that any individual procedural step of the operating cycle has failed to be completed or in the event that the individual steps of the operating cycle are not performed in a predetermined sequential order.

The above, as well as other objects of the present invention, will become apparent when reading the accompanying description and drawing in which:

BRIEF DESCRIPTION OF THE DRAWINGS

FIG. 1 shows an exploded perspective view of the three major components of the present invention utilized to bring members into registry.

FIG. 1b shows a top plan view of the arrangement of FIG. 1a.

FIG. 2a is a cross section along lines 2a—2a of FIG. 2.

FIG. 2b is a cross section along lines 2b—2b of FIG. 2.

FIG. 3 shows a schematic view of the pneumatic controls employed in the apparatus of FIG. 1a.

FIG. 6 is a plan view of the screener table base plate.

FIG. 6a shows an elevational view of the base plate of FIG. 6, as viewed from lines 6a—6a of FIG. 6.

FIG. 7 shows a plan view of the screener table slide member.

FIGS. 7a and 7b show side and end elevational views respectively of the slide of FIG. 7.

FIG. 9 shows a front view of the registration apparatus of the present invention with a screen in the holder and showing the worktable absent any support elements.

FIG. 13 shows an exploded perspective view of the screen holder and screen positioned above the worktable, with the registration apparatus in position on the positioning pins.

FIG. 15 shows an exploded perspective view of the screen holder and screen positioned above the worktable, with the substrate positioned against the positioning pins.

BEST MODE FOR CARRYING OUT THE INVENTION

Figure 1A:
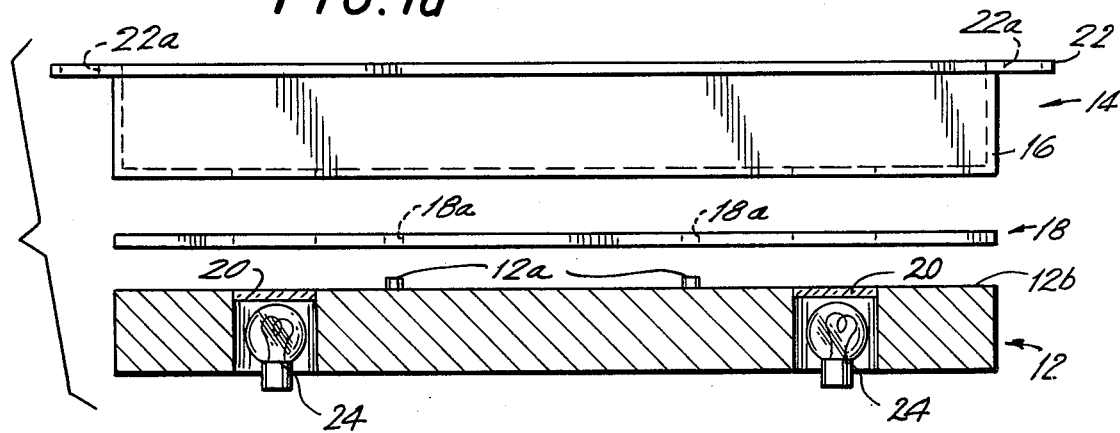
FIG. 1a shows an exploded view of the arrangement of FIG. 1.
Figure 1B:
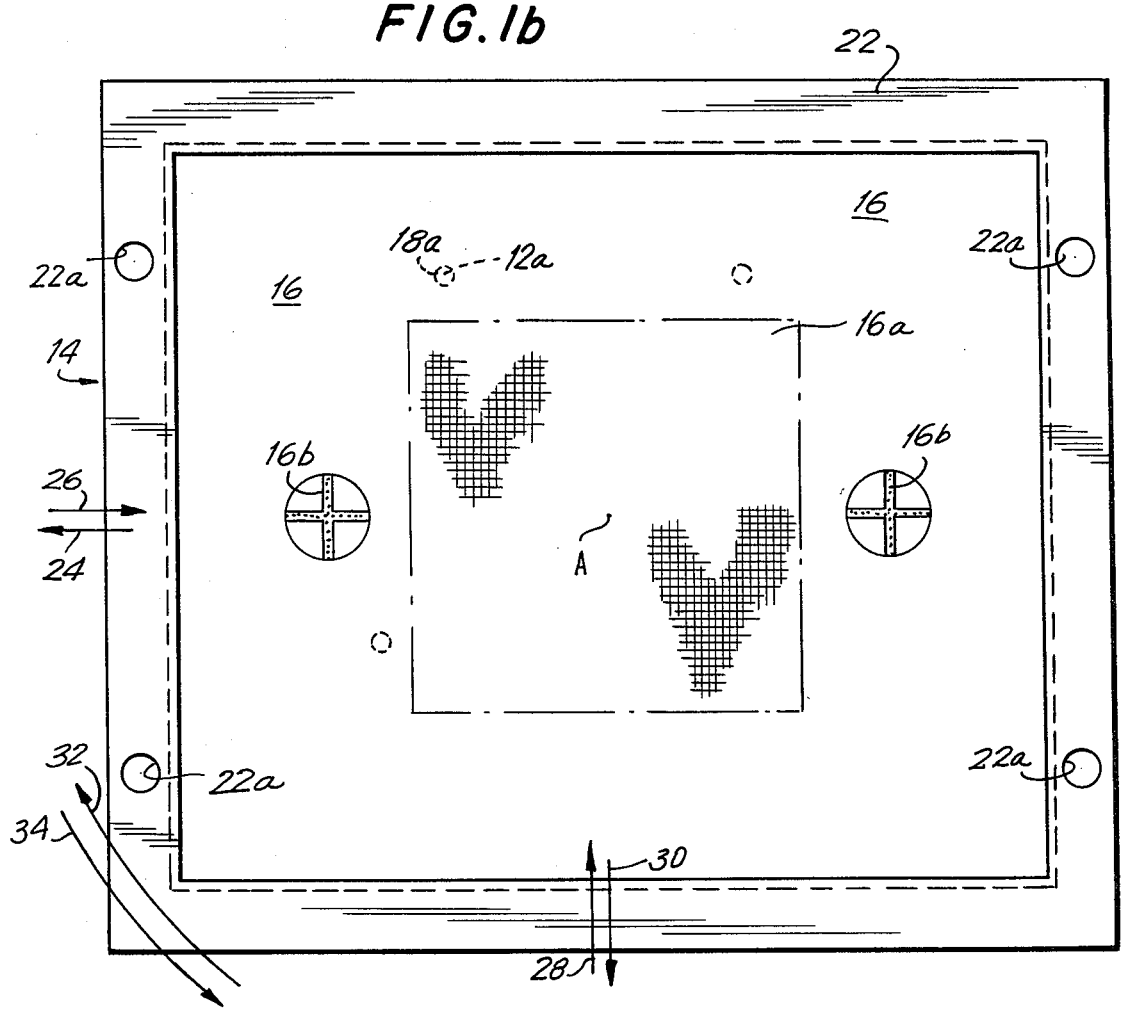

Considering FIGS. 1–1b, there is shown therein, in highly simplified fashion, the major components utilized in the registration technique of the present invention. The registration apparatus 10 comprises a workpiece holder assembly 12, a screen holder assembly 14, including a screen 16, and a registration plate 18. Workpiece holder assembly 12, shown in simplified fashion in FIG. 1, is provided with a plurality of positioning pins 12a which, as will be more fully described hereinbelow, are capable of being selectively moved upwardly so as to extend above the surface 12b of workpiece holder 12 and downwardly so as to prevent the screen 16 from being damaged, in a manner to be more fully described. Workpiece holder 12 is further provided with openings 12c for receiving lenses 20, each lens being transparent to electromagnetic radiation and especially such radiation in the visible light spectrum.

The screen assembly 14 is comprised of a frame 22 having openings 22a arranged to receive supporting projections upon a movable holder, to be more fully described to align said frame 22 on said holder, and having a central portion 22b for receiving and supporting screen 16 which is provided with a central region 16a having the pattern to be transferred to the workpiece, which may, for example be a printed circuit board, integrated circuit, or the like.

The region of screen 16 surrounding central region 16a is opaque to both light and ink and is provided with a pair of patterns 16b, 16b each having a cross-shaped configuration which is transparent to the aforesaid electromagnetic radiation but which is opaque to ink, for a purpose to be more fully described.

Registration plate 18 is provided with openings 18a arranged in a pattern identical to the arrangement of pins 12a provided as part of the workpiece holder assembly 12. Registration plate 18 may be preferably formed of a thin gauge metallic material such as, for example, stainless steel having a thickness of the order of 0.0020 inches. The registration plate 18 is utilized to bring the screen 16 into precise registry with the workpiece to be placed upon work holder assembly 12 and, to accomplish this, in addition to being provided with registration openings 18a, registration plate is provided with a pair of registration patterns 18b each being defined by four (4) pie shaped or quadrant shaped openings 18c. Each quadrant shaped opening 18c is defined by two linear side edges 18c-1 and 18c-2 arranged at right angles relative to one another and a third, curved edge 18c-3 whose end points join the end points of straight edges 18c-1 and 18c-2 to form a substantially right-angle-shaped quadrant opening. The straight edges 18c-1 and 18c-2 of each of the four openings 18c collectively define a cross-shaped opaque region which may be characterized as being comprised of four linear segments 18d-1 through 18d-4 defining the cross-shaped opaque configuration with the thickness $t_1$ of said sections being equal to one another and being equal to the thickness of each arm of the transparent cross-shaped registration patterns 16b of screen 16.

The manner in which the screen 16 is brought into registration with the registration plate 18 and hence with the positioning pins 12a is as follows:

The pins 12a are lifted to the position where they extend upwardly from the surface 12b of the workpiece holder assembly 12. Registration plate 18 is positioned upon surface 10 so that the openings 18a each receive an associated one of the pins 12a. A vacuum means (not shown in FIG. 1) which will be more fully described, communicates with an openings 12d provided in surface 12b. A shallow recess 12e in the form of four grooves 12e-1 through 12e-4 collectively forming a square-shaped pattern together with diagonally aligned segments 12f-1 through 12f-4, collectively forming an x-shaped pattern, to define a shallow recess region R which is covered by registration plate 18 when it is placed upon surface 12b so that, when a vacuum condition is drawn through opening 12d, registration plate 18 efffectively seals the recess pattern 12e causing registration plate 18 to be drawn against surface 12b and retain in position on surface 12b.

The presence of the vacuum condition enables pins 12a to be lowered so that their top surfaces are at least flush with surface 12b, enabling the screen holder 14 to be lowered toward the positioning work holder assembly 12 and enabling the undersurface of screen 16 to engage the top surface of registration plate 18 whereby members 16 and 18 have their surfaces in intimate contact with one another.

As can best be seen in FIG. 1a, the workpiece holder assembly 12 is provided with a pair of bores containing a pair of light sources 24 which are illuminated to direct visible light through their respective lenses 20 as well as the registration patterns 18b and 16b positioned thereabove. Registration plate 18, when initially fabricated, is designed to have the registration patterns 18b substantially immediately above an associated one of the lenses 20. Similarly, screen 16, when fabricated, is designed to have registration patterns 16b precisely located and oriented relative to one another so as to be the same distance apart and so as to have the same orientation as registration patterns 18b have with respect to one another.

In order to be assured that the cooperating registration patterns 16b and 18b are in perfect registry, the screen holder assembly 14, as will be more fully described hereinabove, is mounted upon a holder which, after lowering screen 16 so that it rests upon registration plate 18, enables the holder assembly 14 and surface 12b to be moved in a horizontal directon in a plane relative to one another as shown by arrows 24 and 26 and to be independently moved in the vertical direction in said plane as shown by arrows 28 and 30 as well as being capable of being rotated about a central axis A to provide an angular adjustment whereby assembly 14 and surface 12 are preferably capable of being rotated in either the clockwise or counterclockwise directions relative to one another as shown by arrows 32 and 34, respectively. These three mutually independent movements enable patterns 16b to be placed in exact registry with associated ones of the cooperating patterns 18b. The movement of precise registry is easily determined, due to the nature of the registration patterns. As was described hereinabove, the cross shaped registration patterns 16b are transparent and permit the passage of light therethrough. Conversely, although the quadrants 18c are transparent to the electromagnetic radiation, the cross-shaped patterns defined by the quadrant-shaped openings are opaque to the electromagnetic radiation. Thus the condition of precise registration is easily determined by viewing the superimposed members 16 and 18 preferably from above and observing the light passed by planar members 16 and 18 wherein, when no light passes therebetween, precise registration is thereby obtained. The adjustment means, commonly referred to as an XY adjustment assembly, which is conventional, may be positioned to support surface 12, as will be more fully described.

Once the horizontal, vertical and rotational adjustments referred to hereinabove have been completed, the operating members which have been manipulated to so move the workpiece holder assembly 12 relative to a holder 14 to be more fully described hereinabove, are no longer manipulated during subsequent operations and, although the holder assembly to be more fully described is capable of being reciprocated in first and second directions respectively toward and away from the work holder table 12, screen holder 14 and hence screen 16 retain its precise registry relative to registration plate 18 and hence relative to worktable 12 and more specifically to positioning pins 12a. Once precise registry has been obtained, the screen holder is lifted to a position a spaced distance above surface 12b of worktable 12. Thereafter, the vacuum condition is removed and registration plate 18 is removed from the worktable 12.

A workpiece, such as a planar printed circuit board upon which the pattern in the region 16a of screen 16 is to be transferred, is initially provided with squared edges. The workpiece is thus simply and yet precisely oriented upon work table 12 by lifting pins 12a and positioning the workpiece upon surface 12b so that the squared edges lie against the raised pins 12a. Pins 12a may be designed so that their upper surfaces lie a distance above surface 12b which is equal to or less than the thickness of the workpiece. Alternatively, the vacuum condition referred to hereinabove may be initiated and the pins 12a lowered so that the vacuum retains the workpiece in the proper position. Thereafter, the screen holder 14 is lowered placing the screen pattern portion 16a in surface contact with the top surface of the workpiece on table 12 in readiness for the screen printing operation. No further registration steps need be performed since the screen 16, previously brought into registry with registration plate 18 and hence with positioning openings 18a as well as positioning pins 12a, retains its registry position.

In the case of screen printing, ink or another suitable liquid is placed upon the top surface of screen 16. A squeegee, to be moe fully described, is lowered to bring its blade into surface contact with the top surface of screen 16. The squeegee is then moved across the top surface of screen 16 causing the ink desposited upon the top surface of the screen to be passed through the screen and transferred to the top surface of the workpiece.

Successive workpieces similar to the printed circuit board described above may be subjected to a screen printing operation without the performance of any additional registration operations beyond the first registration operation mentioned hereinabove, simply by lifting the screen holder 14 a spaced distance above worktable 12, removing the workpiece which has just undergone screen printing from worktable 12 and replacing it with the next workpiece to undergo screen printing. Obviously each subsequent workpiece is provided with positioning surfaces which concide with the positioning pins 12a.

Sucessive patterns may be brought into precise registry on a single workpiece through use of the following operating procedures:

The first pattern to be formed upon a workpiece is accomplished through the technique described hereinabove namely wherein the screen containing the first pattern is positioned in work holder 14, registration plate 18 is positioned upon worktable 12 in the manner described hereinabove and screen 16 and registration plate 18 are brought into registry as was described hereinabove. Plate 18 is then removed and replaced by the workpiece. The pattern provided in area 16a of screen 16 is then created upon the top surface of the workpiece in the manner described hereinabove.

Thereafter, the screen holder 14 is raised above table 12 and the workpiece supported thereon, screen 16 is removed from holder 14 and the workpiece is removed from table 12. Registration plate 18 is again placed upon table 12 so that its positioning openings 18a each receive an associated one of the positioning pins 12a which have been lifted for this purpose, in order to precisely position registration plate 18 on table 12. The vacuum condition is then reinstituted, pins 12a are lowered and thereafter screen holder 14, now holding the second screen, is lowered upon registration plate 18. The registration patterns 16a and 18a are brought into registry with one another in a manner previously described by approriate movement of screen holder 14 and worktable 12 in the mutually independennt horizontal, vertical and rotational directions relative to one another as was described hereinabove. Upon achieving the condition of registry, i.e., upon noting that light no longer passes through the pair of superimposed registration patterns 16b and 18b, screen holder 14 is then lifted upwardly and away from worktable 12, the vacuum condition is released and registration plate 18 is removed from worktable 12 and is replaced by the workpiece containing the first pattern transferred thereto, the workpiece being precisely oriented and positioned on worktable 12 by virtue of the cooperating relationship between the positioning surfaces provided in the workpiece and positioning pins 12a. Thereafter, screen holder 14 is lowered to bring at least the screen pattern area 16a into engagement with the top surface of the workpiece. The screen printing operation is then repeated in substantially the same fashion as was described hereinafter whereupon the second pattern transferred to the workpiece is in precise registry with the aforementioned first pattern transferred thereto.

It should be understood that the patterns transferred to the above-mentioned workpiece need not be carried out in successive fashion, i.e. immediately after one another, and, in fact, the workpiece may be exposed to other process steps. For example, if the pattern transferred to the workpiece is a photo-resistive material, the workpiece may be exposed to an etching and cleaning operation for example before having the next pattern transferred thereto through the use of the apparatus of the present invention. Obviously any other operations or processes may be performed between any two pattern forming operations and/or registry operations of the types described hereinabove. Thus the present invention lends itself to simply and yet rapidly bringing a pattern carrying member into registry with a workpiece to assure precise registry as between a multiplicity of patterns on a single workpiece as well as to assure precise registry of a single pattern upon a multiplicity of workpieces. Alternatively, the invention lends itself to bringing members other than screens into registry with the workpiece. For example, the screen may be replaced by a mask which may be brought into registry with the workpiece in the same manner as was described hereinabove for exposing a photo-resist film provided on the surface of the workpiece to light in a pattern determined by the configuration of the aforesaid mask. The above two applications should however be considered as being merely exemplary and not in any way limiting with respect to the extent of applications which may advantageously utilize the method and apparatus of the present invention.

Figure 2:
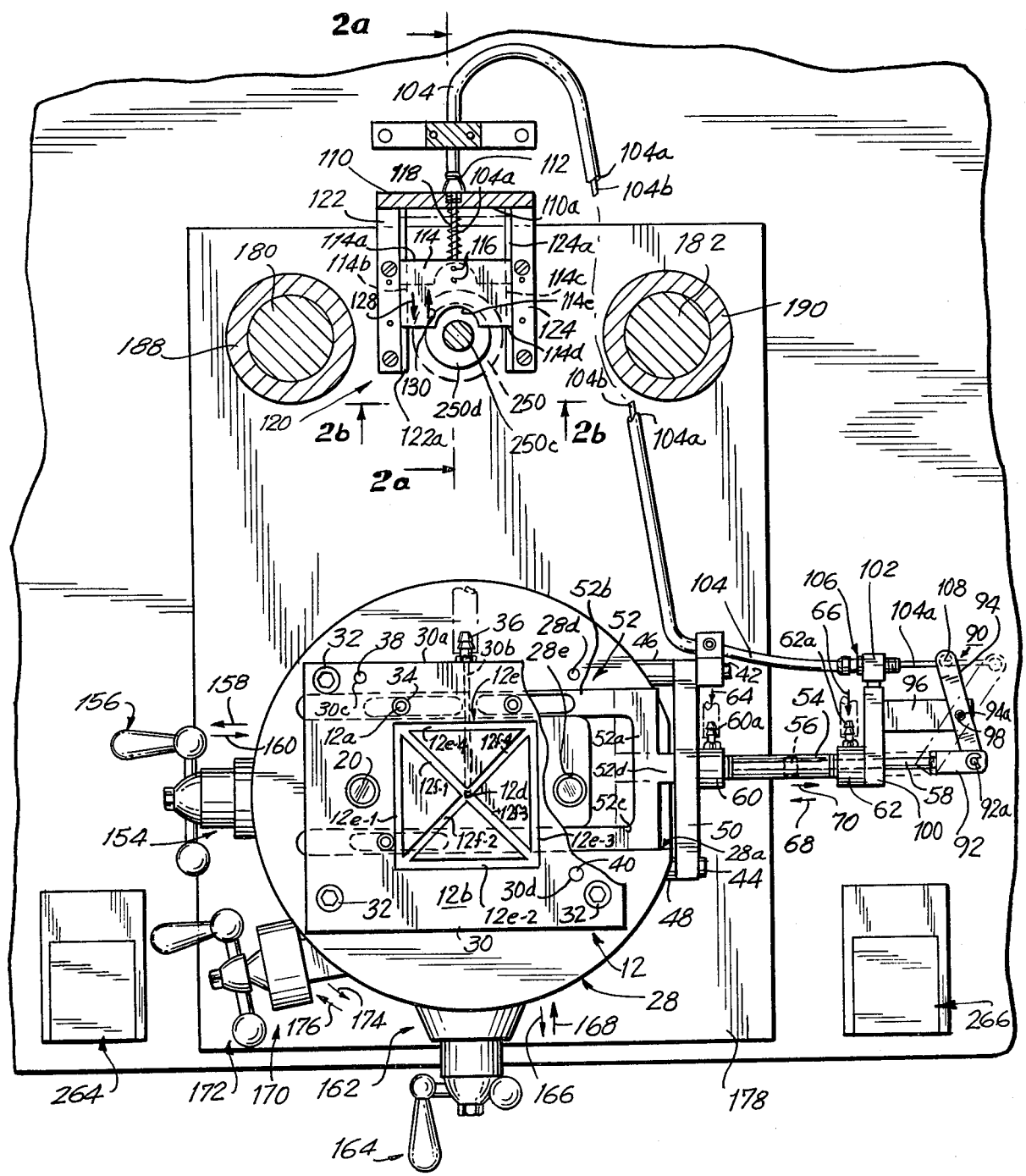
FIG. 2 shows a plan view of the screener table and safety assembly.

FIG. 2 shows a detailed plan view of the work table assembly 12 of FIG. 1 which is comprised of a base plate 28 supporting a top plate 30 whose top surface 12b is shown in FIG. 1. Fastening members 32 secure top plate 30 to base plate 28. The positioning pins 12a extend through openings in top plate 30 which further contain bushings 34 surrounding the positioning pins 12a. The shallow recess 12e surrounding opening 12d is substantially identical to that shown in FIG. 1. A hose fitting in the form of a nozzle 36 is provided along side wall 30a of top plate 30 to telescopingly receive a hollow tubular hose (not shown) in order to couple a vacuum source (not shown) to opening 12d through an elongated bore 30b provided in top plate 30.

Base plate 28 is also shown in the top and end views of FIGS. 6 and 6a and is comprised of a substantially U-shaped recess 28a having a central recessed portion 28a-1 and two recessed arm portions 28a-2 and 28a-3. Bores 28b provided in arm portion 28a-2 of the U-shaped recess slidably receive two of the positioning pins 12a while bores 28c arranged in arm 28a-3 slidably receives the remaining positioning pin. Tapped openings 28d threadedly engage fastening members 32 as shown best in FIG. 2.

The pair of openings 28e receive the lamps 24 shown for example in FIG. 1a.

Openings 28f and 28g cooperate with openings 30c and 30d respectively provided in top plate 30 for receiving dowel pins 38 and 40, which openings in base plate 28 and top plate 30 cooperate with dowel pins 38 and 40 to position and align base plate 28 with top plate 30.

Tapped openings 28h and 28j threadedly receive fastening members 42 and 44 for securing brackets 46 and 48 and air cylinder brace 50 to base plate 28.

A slide 52 is slidably positioned and received within the U-shaped recess 28a in base plate 28. Slide 52 is shown best in FIGS. 2, 7, 7a and 7b and is comprised of a yoke portion 52a, having two outwardly extending arms 52b and 52c. Each of said members being adapted to be slidably received within central portion 28a-1 and arm portions 28a-2 and 28a-3 respectively of the substantially U-shaped recess 28a provided in the top surface of base plate 28.

A projection 52d extends outwardly at a point intermediate the ends of yoke portions 52a and is provided with a tapped bore 52d-1 for threadedly receiving the threaded end (not shown) of a piston rod 58 arranged within air cylinder 54. The air cylinder 54 contains a piston 56 arranged at a point intermediate the ends of piston rod 58. The opposed fitting assemblies 60 and 62, provided at the opposite ends of air cylinder 54 are arranged to be coupled with hollow tubular hose members (not shown) for introducing air under pressure into air cylinder 54. For example, when air under pressure is introduced into nipple 62a, of assembly 62 so as to move in the direction of arrow 66, piston 56 is moved in the direction shown by arrow 68 causing piston rod 58 and slide 52 to move in the same direction. When air is introduced into nipple 60a of fitting assembly 60 and is moving in the directon shown by arrow 64, piston 56 is moved to the right as shown by arrow 70, causing piston rod 58 and slide 52 to move in the same direction. Slide 52 controls the reciprocating movement of positioning pins 12a as will be more fully described.

Slide 52, as can best be seen in FIGS. 7-7b, is provided with a pair of elongated slots 52b-1 and 52b-2 in arm 52b and a single elongated slot 52c-1 in arm 52c. The outer side wall 52d of slide 52 is provided with a pair of diagonally aligned slots 52d-1 and 52d-2. The inner side wall 52e is likewise provided with a pair of diagonally aligned slots 52e-1 and 52e-2 which are aligned with slots 52d-1 and 52d-2, respectively. In a similar fashion, inner side wall 52f is provided with a diagonally aligned slot 52f-1 while outer side wall 52g is similarly provided with a diagonally aligned slot 52g-1. Since all three pairs of diagonally aligned slots are identical to one another, only one such pair will be described for purposes of simplicity.

Figure 8:
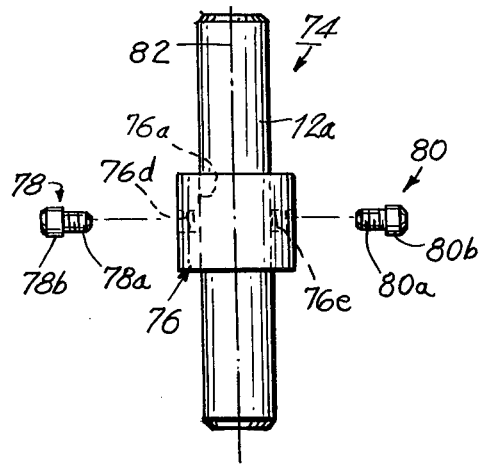
FIG. 8 shows a pin/collar assembly employed with the slide of FIG. 7.
Figure 8A:
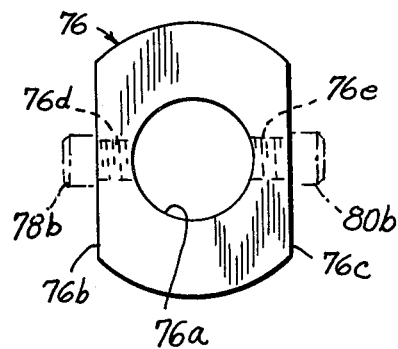
FIGS. 8a and 8b show top and side views respectively, of the collar of FIG. 8.
Figure 8B:
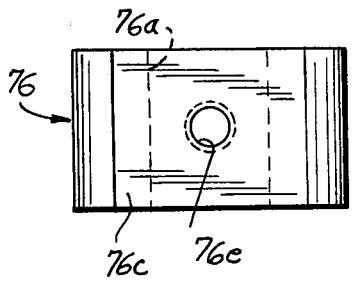

Considering arm 52c, it can be seen that diagonally aligned slot 52g-1 communicates with the elongated slot 52c-1. Slot 52f-1 likewise communicates with slot 52c-1 and is in alignment with diagonally aligned slot 52g-1. Slot 52e-2 which communicates with elongated slot 52b-2 can be seen in dotted fashion in FIG. 7a. Each of these three slots receive a positioning pin 12a which in actuality is comprised of a positioning pin assembly 74 including an elongated pin 12a and a collar 76 provided with a central opening 76a, shown best in FIG. 8a, having truncated sides 76b and 76c through which tapped bores 76b and 76e, respectively, extend so as to communicate with central opening 76a. A pair of threaded pins 78 and 80 have their threaded portions 78a and 80a threadedly engaging tapped openings 76d and 76e so as to secure collar 76 to pin 12a. When fully assembled, the cylindrical-shaped head portions 78b and 80b of fastening members 78 and 80 extend beyond the truncated surfaces 76b and 76c, respectively, and extend into and are slidably received by diagonally aligned slots 52f-1 and 52g-1, respectively. The manner of operation of the slide 52 and pin assembly 74 is as follows:

Pins 12a, as can best be seen from FIG. 8, extend both upwardly and downwardly from collar 76 respectively into openings in top plate 30 and base plate 28 so that the pins 12a experience no movement whatsoever in a direction perpendicular to their longitudinal axis represented by phantom line 82 in FIG. 8. As slide 52 is moved to the right, i.e., in the direction shown by arrow 70, and since pins 12a experience no movement in the direction shown by arrow 70, heads 78b and 80b, which are slidably engaged by diagonally aligned slots 52f-1 and 52g-1, respectively, move upwardly, moving their associated pins 12a in the same direction, until the heads 78b and 80b of these pins reach the left hand ends of diagonally aligned slots 52f-1 and 52g-1, thereby extending the upper ends of pins 12a a spaced distance above surface 12b of top plate 30. By moving slide 52 in the opposite direction, i.e., the direction shown by arrow 68, heads 78b and 80b of fastening members 78 through 80 are caused to move downwardly due to the orientation of diagonally aligned slots 52f-1 and 52g-1, thereby moving their associated pins 12a downwardly to bring the top surface of each pin 12a at least flush with the top surface 12b of top plate 30. Movement imparted to slide 52 is obtained by selectively coupling suitable pneumatic sources to the nipples 60a and 62a of fittings 60 and 62, respectively. Control of the air under pressure introduced into air cylinder 54 will be described hereinbelow in connection with the electrical control circuitry shown in FIG. 4.

As can best be seen in FIG. 2, piston rod 58 is further utilized to position a safety apparatus 90 which prevents the screen holder from being lowered upon the top surface 12b of top plate 30 when pins 12a are extending upwardly from the top plate 30, which condition would cause permanent damage to the screen 16. Safety apparatus 90 is comprised of a pivot rod clevis 92 which threadedly engages the right hand of piston rod 58 and is provided with a pin 92a pivotally mounting of the lower end of rocker arm 94 which is arranged to rotate about its central opening 94a which is pivotally mounted to pivot brace 96 by means of pin 98. Pivot brace 96 is integrally mounted to support brace 100 which is secured to fitting assembly 62 by suitable fastening means (not shown).

An adjustable screw brace 102 is secured to the upper end of support brace 100 and is provided for clamping one end of an adjustable cable assembly 104 thereto. Adjustable cable assembly 104 is comprised of a hollow tubular sleeve 104a containing a slender wire 104b. The clamping assembly 106 clamps the right hand end of sleeve 104a to brace 102. Wire 104b extends through the clamping assembly 106 and is pivotally mounted to the upper end of rocker arm 94 by a pin assembly 108. The opposite end of sleeve 104a is coupled to a slide base plate 110 by another suitable clamping assembly 112 while the opposite end of wire 104a is secured to safety slide 114 by fastening pins 116. A helical spring 118 surrounds the exposed portion of wire 104a and has its left hand end resting against the right hand edge 114a of safety slide 114 and has its right hand end resting against the left hand edge 110a of slide base plate 110.

The safety slide assembly 120 is comprised of the safety bracket 114, slide base 110 and a pair of slide tracks 122 and 124. This assembly is shown best in FIGS. 2 and 2a. It can be seen that the slide tracks 122 and 124 are each provided with a pair of inwardly directed projections 122a and 124a which are slidably received within slots 114b and 114c provided in the side walls of safety slide 114. The slide tracks 122 and 124 are secured by suitable fastening means to the base portion 110a of L-shaped slide base plate 110 enabling safety slide 114 to move in a reciprocating fashion as shown by arrows 128 and 130, under the control of wire 104b of cable 104, which wire is, in turn, moved by the piston rod 58, in a manner to be more fully described. Safety slide 114 is provided with a semicircular shaped groove 114e provided in side wall 114d and cooperates with a vertically aligned cylinder 250 having piston rod 250c and collar 250d extending upwardly from cylinder 250 to control the lifting and lowering the holder 184. In order to limit the position to which the holder 184 may be lowered when pins 12a are in their lifted position, safety slide 114 is moved over collar 250d as will be more fully described hereinbelow.

FIGS. 9 through 19 show the printing apparatus 150 of the present invention incorporating the novel registration apparatus described hereinabove and showing base plate 28 supported upon an XYθ adjustment assembly 152 for independently and yet cooperatively adjusting base plate 28 and hence top plate 30. By manipulation of the handle 156 forming part of the X adjustment assembly moves base arrow 158 or 160. Assembly 162 is provided with operating handle 164 for moving base plate 28 and hence top plate 30 in the Y direction as shown by arrows 166 and 168. Assembly 170 is provided with operating handle 172 for changing the angular orientation of base plate 28 and hence top plate 30 so as to rotate the base plate 28 selectively in one of the angular directions shown by arrows 174 and 176. As was described hereinabove the XYθ adjustment assembly 152 serves to bring the registration plate 18 positioned thereon into registry with the screen 16 as was described hereinabove.

The XYθ assembly 152 is arranged upon a support 178 having a pair of upright cylinders 180 and 182 which extend through guide bushings 188 and 190 provided in U-shaped holder member 184. Drive means 250, comprising a cylinder having a piston-operated piston rod 250c engaging the underside of U-shaped holder 184, is provided for selectively raising or lowering the holder 184 relative to support 178 vertically upward as shown by arrow 196 or vertically downward as shown by arrow 198.

Holder member 184 has a central or yoke portion 184b and a pair of integral arm portions 184c and 184d extending forwardly therefrom. A pair of clips 202 and 204 are positioned inwardly of the rear edge 184e-1 of an opening defined by yoke portion 184b and arms 184c and 184d so as to cooperate with the top surface of the yoke portion adjacent edge 184e to receive the rearward flange 22c of holder 22 (note also FIG. 16) flanges 22d and 22e rest upon the surfaces of arms 184c and 184d so that the edges of these flanges extend inwardly from the edges 184c-1 and 184d-1 of arms 184c and 184d, respectively. Rotatable eccentric clamping members 206 and 208 have manually grippable projections 206a and 208a which may be gripped by the operator to rotate the clamping members which are eccentrically mounted about pivots 206b and 208b, respectively so as to cause a portion of the clamping means to be positioned over the flanges 22d and 22e, thereby clamping the screen holder 22 in position. Openings 22a are arranged to cooperate with projections 210 arranged in arms 184c and 184d to properly position the screen holder 22 upon movable holder 184.

A pair of guide rods 212 and 214 are arranged in spaced parallel fashion and are secured to the mounting brackets 212a-212b and 214a-214b, respectively, which brackets are secured to the top surface of holder 184. A rigid elongated plate 216 is provided with openings (not shown) which receive bushings 218 and 220. Elongated rods 212 and 214 extend through bushings 218 and 220 to slidably mount plate 216 therealong. Piston assembly 224, provided with a piston mounted within the cylinder and not shown for purposes of simplicity, controls the movement of piston rod 224a which is secured to plate 216 along the rear surface thereof and intermediate the ends thereof. By selectively introducing air under pressure through tubes 226 and 228, respectively, coupled to fittings 224b and 224c provided in the piston cylinder of piston assembly 224, the plate 216 is selectively movable in the opposed directions shown by arrows 230 and 232. Plate 216 may be made to sweep across the screen pattern region 16a of screen 16 arranged within screen holder 22.

The center of plate 216 is provided with an upwardly extending projection 216a. A piston assembly 234 is mounted along the front surface of projection 216a and has a pair of fittings 234a and 234b, respectively, coupled to hoses 236 and 238 for selectively introducing air under pressure into the piston cylinder assembly so as to control its piston rod 234c to move squeegee holder 240 either upwardly or downwardly. Squeegee holder 240 has a squeegee 242 releasably secured thereto.

Figure 11:
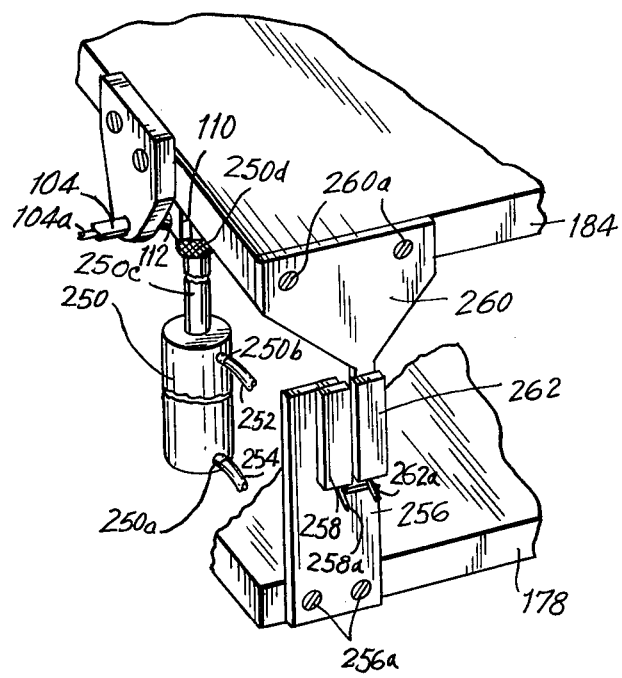
FIG. 11 is a rear perspective view showing the spacer block partially surrounding the up-down cylinder prior to the initiation of a registration cycle.
Figure 10:
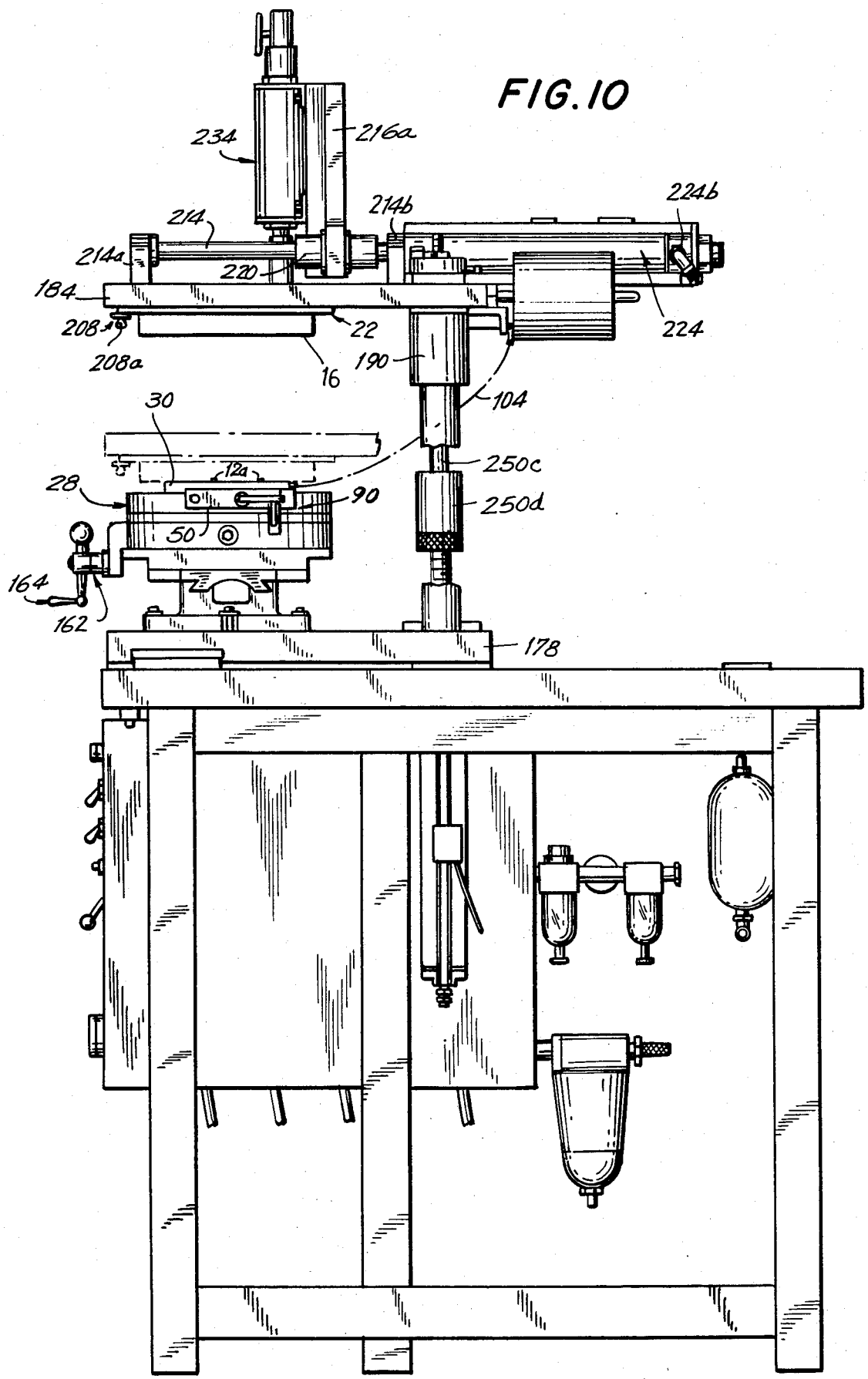
FIG. 10 shows a side view of the registration apparatus of FIG. 9.
Figure 12:
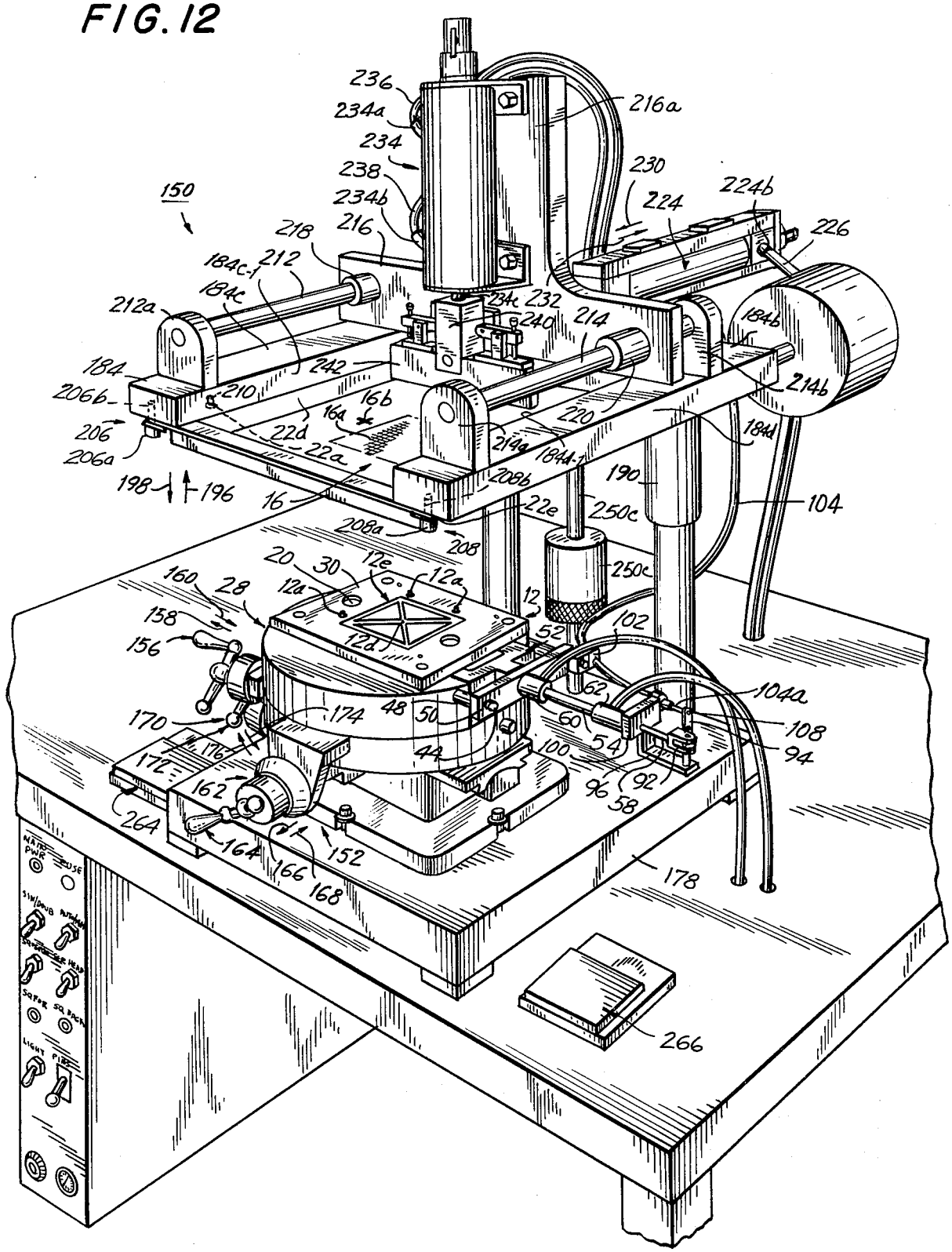
FIG. 12 shows a top perspective view of the registration assembly with the holder in the up position and showing the worktable absent any members and with the positioning pins in the extended position.
Figure 14:
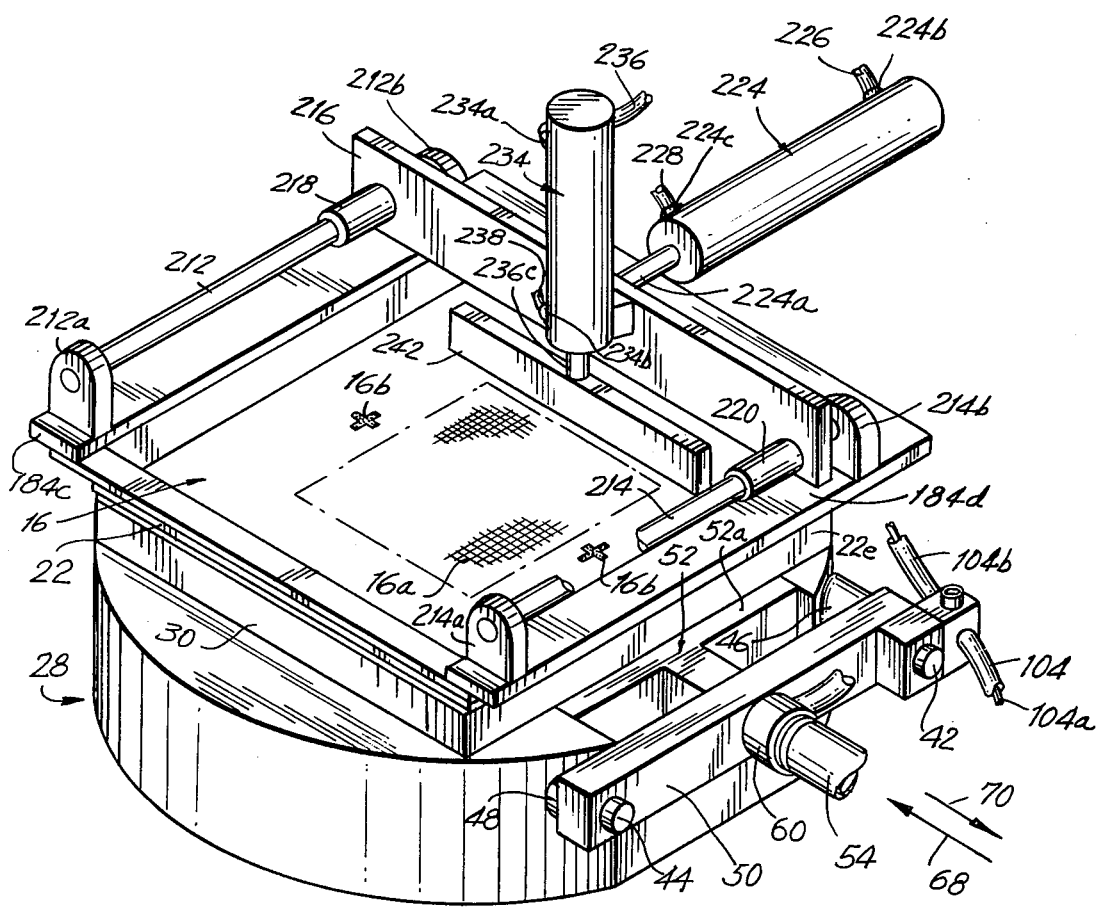
FIG. 14 shows a perspective view similar to that of FIG. 13 with the holder and screen in the down position and the pins in the retracted position.
Figure 16:
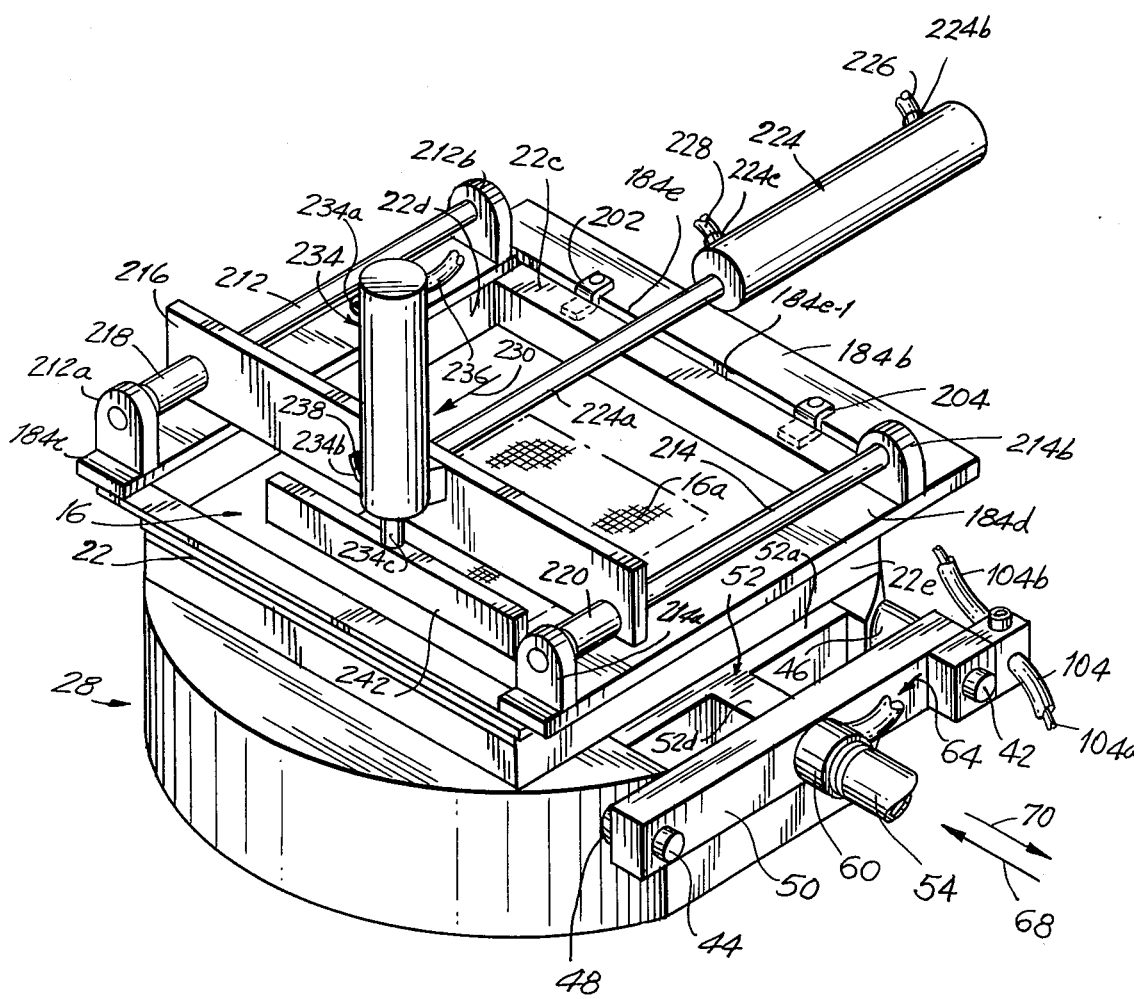
FIG. 16 shows a perspective view similar to that of FIG. 15 with the holder and screen in the down position, and the squeegee moved forward in its operative position.
Figure 17:
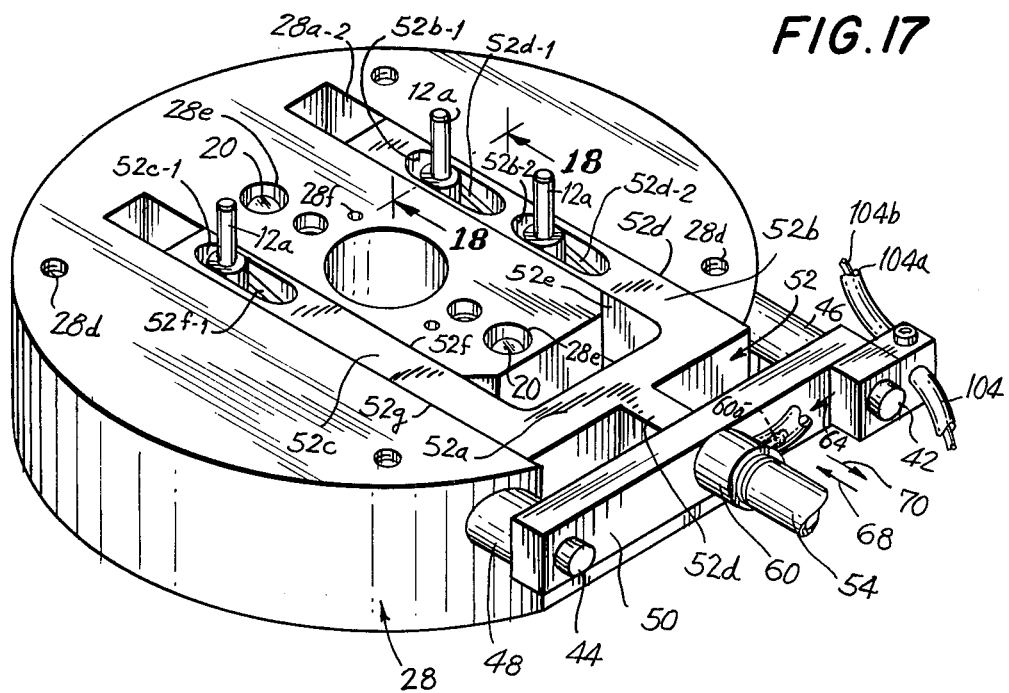
FIG. 17 shows a perspective view of the top plate with the worktable removed to expose the slide mechanism.
Figure 18:
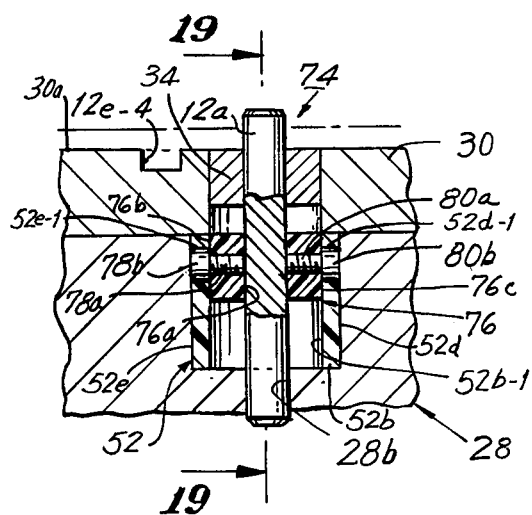
FIG. 18 is a cross sectional view taken generally along the lines 18—18 of FIG. 17.
Figure 19:
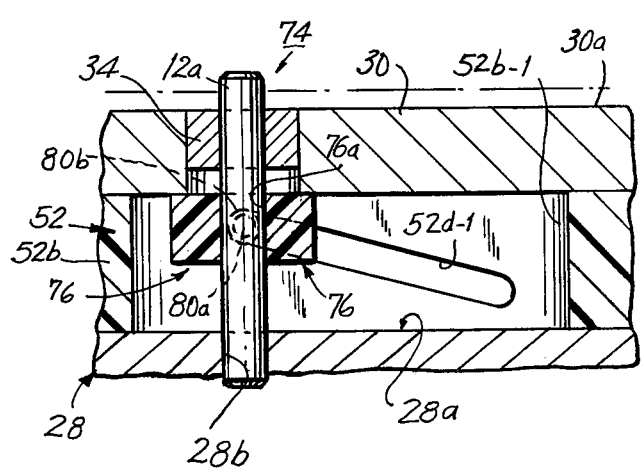
FIG. 19 is a cross sectional view taken generally along the lines 19—19 of FIG. 18.

As shown best in FIG. 11 air cylinder 250 is mounted upon support 178 and is provided with fittings 250a and 250b, respectively, coupled to tubes 252 and 254 for introducing air under pressure into the cylinder in order to respectively raise or lower piston rod 250c, which piston rod extends upwardly and is secured to the underside of holder 184. FIG. 2 shows the position of the piston rod 250c and cylinder 250. The operation is as follows:

When slide 52 is pulled to its right-hand-most position as was described hereinabove in connection with FIG. 2, the wire 104a moves safety slide 114 to its left-hand-most position so that, although the semicircular-shaped portion 114e is spaced a short distance from piston rod 250c, the semicircular-shaped portion 114e nevertheless extends over the top surface of adjustable collar 250d thereby preventing holder 184 from being lowered by virtue of the engagement between the underside of safety slide 114 and the top surface of collar 250d. This prevents the screen from being lowered upon the top plate when positioning pins 12a extend upwardly above the surface of the top plate 30.

When slide 52 is moved to its left-hand-most position, cable wire 104a moves safety slide 114 to its right-hand-most position, whereby semicircular-shaped surface 114e is displaced from collar 250d enabling holder 184 to move downwardly beyond the safety blocking position and enabling the screen 16 to engage the surface of either the workpiece or the registration plate 18. This condition is permissible since movement of the slide 52 to its left-hand-most position lowers positioning pins 12a so that their top surfaces are at least flush with the top surface of top plate 30.

As shown best in FIG. 11 a bracket 260 is secured to one side edge of holder 184 by fastening means 260a. Bracket 260 supports a magnetic type reed switch 262 thereon. Bracket 256 is secured to base support 178 by fasteners 256a and supports a similar magnetic reed switch 258. The switches 258 and 262 are brought into exact alignment only when the holder 184 is lowered into the operative position with the screen 16 resting upon the workpiece. Under those conditions, switches 258 and 262, which are coupled into an electrical circuit through wire pairs 258a and 262a, serve to permit completion of an electrical circuit to be more fully described when operation of the squeegee is desired. The sequence of operations of the squeegee is such that cylinder 234 is activated to bring the squeegee down on the surface of the screen 16 and the squeegee, which is now in the down position, across the screen in order to transfer ink deposited upon the screen, through the screen and onto the workpiece. Means are provided for rotating the squeegee holder to cause the squeegee to sweep across the printing screen region 16a at a skewed angle.

Figure 3:
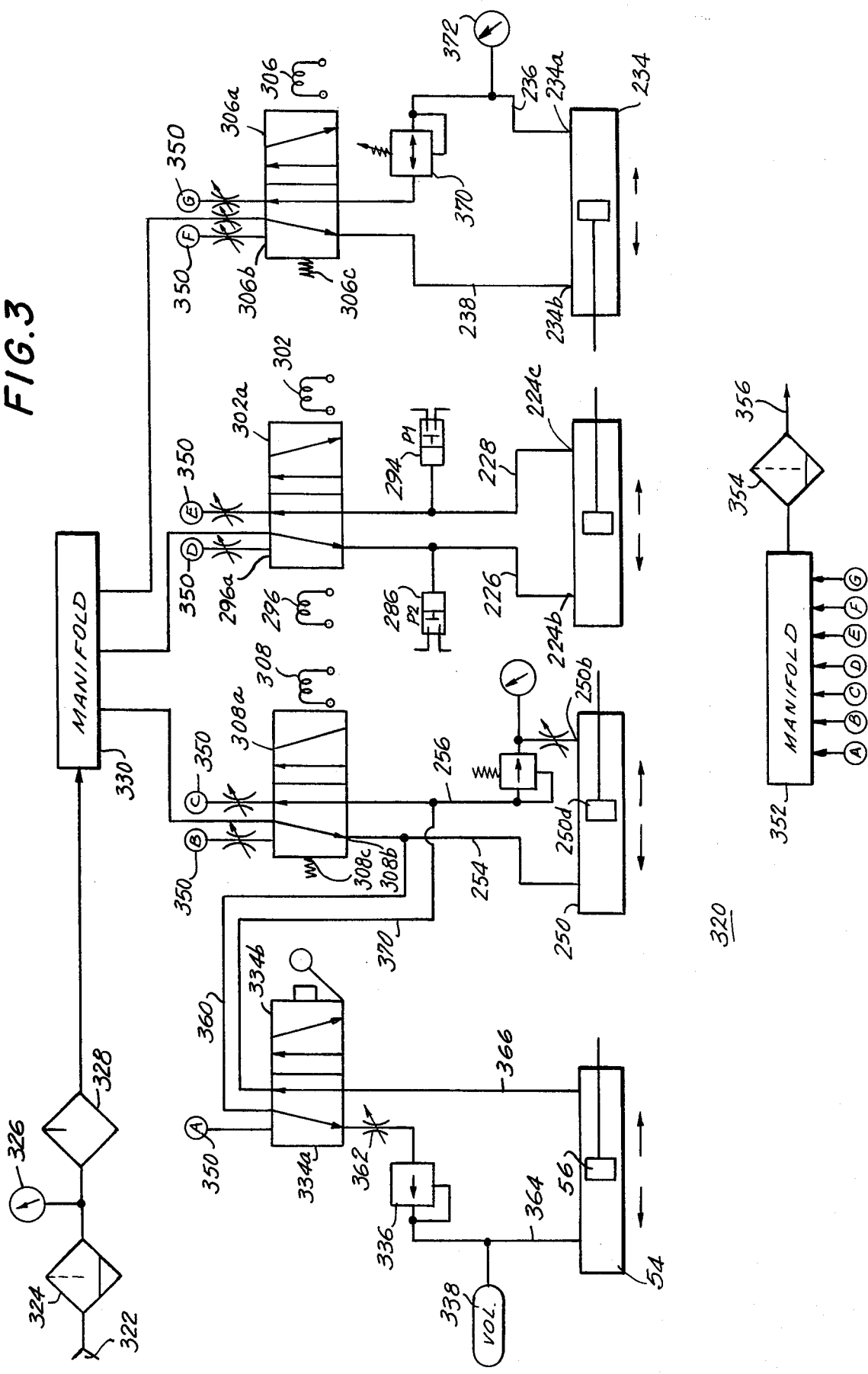
Figure 4:
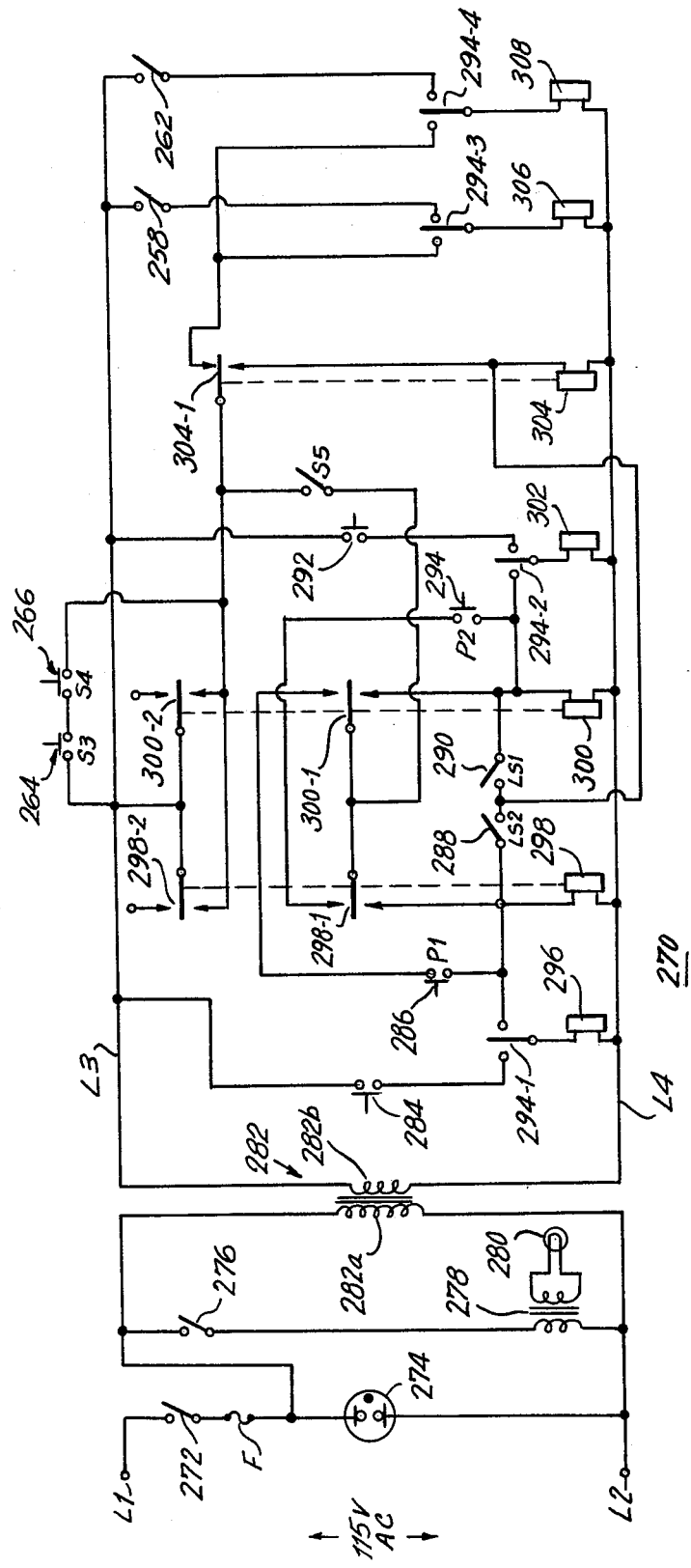
FIG. 4 is a schematic diagram of the electronic control for the apparatus of FIG. 1.
Figure 5:
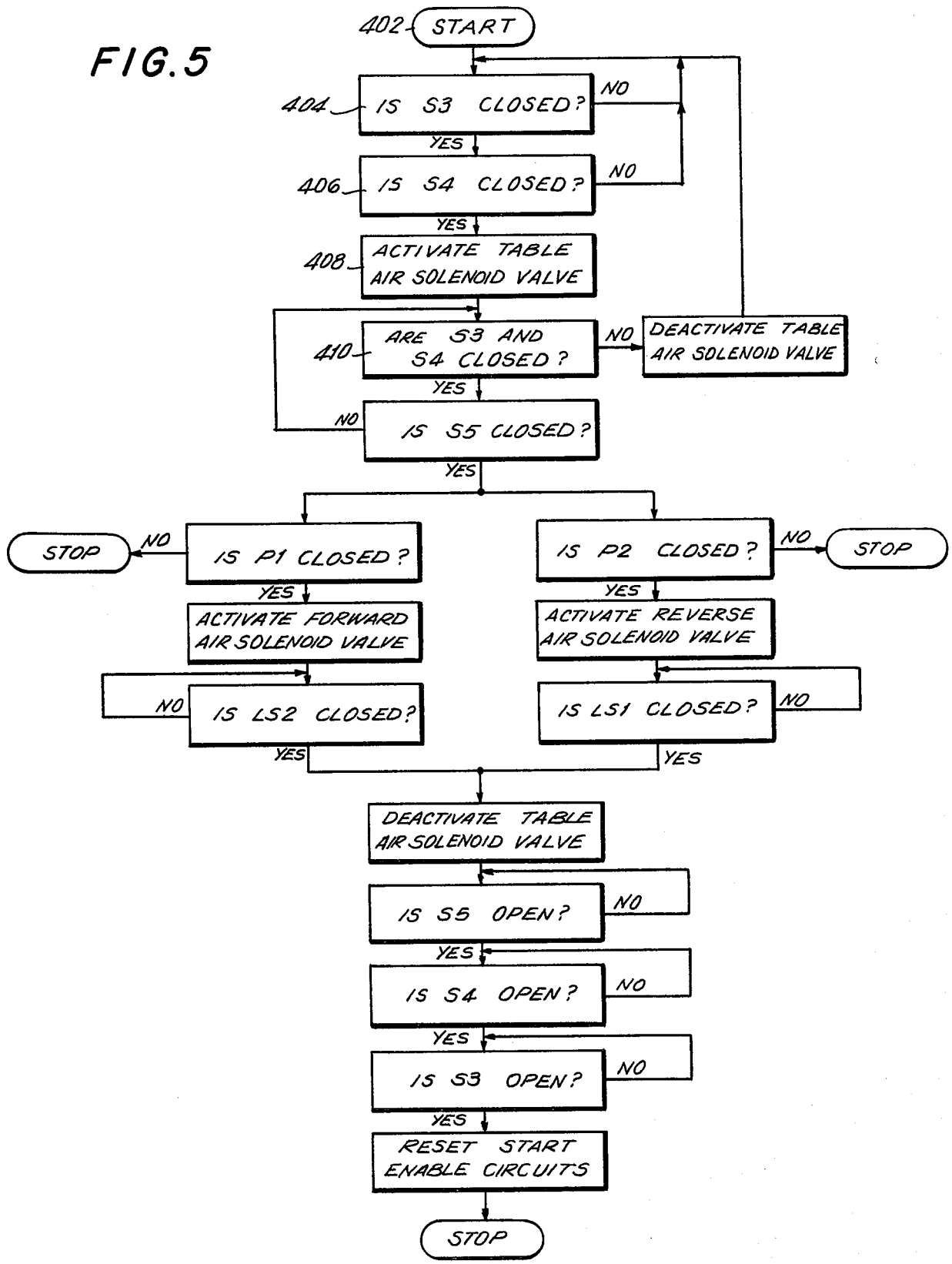
FIG. 5 is a flow diagram depicting the sequence of operations of the apparatus of FIG. 1.

The control circuitry 270 is shown best in FIG. 4 and the valves operated by the control circuitry 270 and forming the pneumatic system 320, as shown in FIG. 3. FIG. 5 shows a flow diagram of sequential operating steps performed by the apparatus. Considering FIGS. 3 through 5, operation, beginning at the start position 402 advances to stage 404 whereupon, when switch S1 shown as switch 272 in FIG. 4 is closed, the neon lamp 274, coupled across the power lines L1 and L2 in series with switch 272 and fuse F, is illuminated causing power to be coupled to the primary winding 282a of transformer 282. Power is thereby coupled to lines L3 and L4 through secondary winding 282b.

Transformer 278 illuminates lamp 280 when alignment light switch 276 is closed which occurs when light is to be passed through the registration marks in the registration plate and screen.

115 v AC is applied to terminals L1 and L2. When power switch S1 is closed, power is applied to the primary of the stepdown transformer causing the voltage to be reduced to 24 v AC. When it is desired to operate the machine, both 53 and 54 (start switches) are pressed to their closed position thus allowing power to be applied through the N.C. contact of relay 1 (304-1) to the squeegee air valve (306) and table air valve (308). This in turn reverses the air flow to the squeegee down cylinder (234) and table down cylinder (250). The reversed air flow from the table air valve (308) is also applied through manual air valve (334) to alignment pin cylinder (54) because air pressure on line 364 is held lower than available pressure on line 366 by nature of miniature regulator 336, and cylinder (54) retracts instantly, while cylinder (250) retracts slowly due to needle valves on exhaust lines 350 B-C.

When cylinder (250) has reached its lowest position down and switch (S5) closes power is applied through the N.C. contacts 298-1 and 300-1 to pressure switch P1 (286) and P2 (294). Because air valve (296) is a double-acting type, either P1 or P2 will be closed, but not both. When forward/backward cylinder (224) is in the backward position, P1 will be closed, whereas when it is in forward position P2 will be closed. Assuming P1 is closed, power is applied to R2 (293) and air valve (296). Relay 298 pulls in thereby removing power from P2.

Air valve 296 activates causing pressure in line 228 to be vented to atmosphere and line 226 to be pressurized.

Thus, P1 is opened and P2 closes. However, as power has previously been removed from P2 by contact 298-1 no change is observed in relay 300 and air valve 302. When relay 298 pulls in, contacts 298-2 close allowing 53 and 54 to be released without interrupting the operation. However, if 53 or 54 are released before 55 closes (that is, table in down position) air valves 306 and 308 deactivate causing table and squeegee to return to the upper position.

As line 226 is now pressurized, cylinder 224 begins to travel slowly to the forward position. The speed of travel is controlled by needle valves 350-D-E (one for each direction). During the travel sequence, LS1 closes initially. However, as relay 300 has no power applied, this causes no change in system status. Eventually, near the end of the stroke LS2 closes causing relay 304 to pull in. By nature of contact 304-1, relay 304 latches itself on and power is removed from 306 and 308. Travel continues so that LS1 is opened, but 304 stays latched through contact 304-1. Once power is removed from 306 and 308, cylinder 234 snaps back and table cylinder 250 begins to slowly reverse direction. As line 254 is now pressurized, a flow of air begins through 360, 334 where it is restricted by needle valve 362. A reduced flow of air continues through 336 to accumulator 338 and cylinder 54. 338 affects a time delay by preventing an immediate buildup of pressure at cylinder 54.

When the pressure in 54 is sufficient to overcome friction, the pins snap up. When cylinder 250 reaches a predetermined position, switch 55 opens deactivating 298 and 296. If switches 264 or 266 are open, relay 304 also deactivates. However, if 264 and 266 are closed, relay 304 continues to be latched by deriving its power through contact 304-1 and 264 and 266. This prevents a restart until all switches are released. Releasing 264 or 266 deactivates 304.

When a re-start occurs, P2 is now closed and power is applied to 300 and 302 causing cylinder 224 to reverse direction.

Air valve 334 is used solely to manually retract pins while table cylinder 250 is in up position.

What is claimed is:

1. A method of bringing a substantially planar first member, having a registration pattern, into registration with a substantially planar second member, having locator means, through the employment of an alignment sheet, having a registration pattern, a first support having retractable locator projections and a holder for releasably holding and supporting the first planar member and registration means for movably positioning the holder and the first support relative to one another, comprising the steps of:
    (a) raising the locator projections above the surface of the first support;
    (b) placing the alignment sheet having locator means for receiving said projections on said surface and aligned so that said locator means receive said projections;
    (c) retracting said projections so that they are removed from the alignment sheet;
    (d) mounting the first planar member upon said holder;
    (e) moving the holder to place the first planar member upon the top surface of the alignment sheet;
    (f) operating the registration means to move said first planar member and said alignment sheet relative to one another to bring their respective registration patterns into registry;
    (g) raising said holder and removing said alignment sheet to enable placement of the second planar member in registry with the first planar member by positioning the locator means of the second planar member upon said projections.

2. The method of claim 1 further comprising the steps of:
    removing the first planar member from said holder;
    placing another planar member, having a registration pattern on said holder; and
    removing said second planar member and repeating steps (a) through (g) to bring said another planar member into registry with the second planar member.

3. The method of claim 1 wherein said support is provided with an opening communicating with surface thereof, wherein method step (c) further comprises applying a vacuum condition to said opening to hold said alignment sheet to said surface in the absence of said projection means.

4. The method of claim 1 wherein step (g) further comprises:
    placing a safety barrier between said support and said holder to prevent the planar member from engaging said locator projections as said holder is lowered; and removing said safety barrier only after said locator projections are lowered.

5. A method for bringing a first type of planar member, having a first registration pattern, into registry with a second type of planar member having locator means, through the use of an alignment sheet having a second registration pattern and a second locator means employed with a support, having projection means and a receiving surface, a holder and means movably mounting the holder relative to the support, comprising the steps of:
(a) placing the alignment sheet on said surface with said second locator means engaging said projection means to precisely locate the alignment sheet at a predetermined location on said surface;
(b) mounting the first planar member on said holder;
(c) moving the holder to position the first planar member onto the alignment sheet;
(d) directing electromagnetic radiation toward the registration pattern in said alignment sheet;
(e) moving said first planar member and said holder relative to one another until said first registration pattern and said second registration pattern alter the magnitude of radiation passing therethrough to a predetermined radiation level;
(f) raising the holder;
(g) removing the alignment sheet from said surface;
(h) placing the second planar member on said surface; and
(i) positioning the locator means of said second planar member upon said projection means to bring said first and second planar members into registry.

6. The method of claim 5 wherein said electromagnetic radiation lies in the visible spectrum.

7. The method of claim 5 further comprising the steps of removing the second planar member from said surface and placing another planar member having locator means upon said surface and positioning said locator means on said projection means to thereby place said another planar member in registry with said first planar member.

8. The method of claim 5 further comprising the steps of:
(a) raising said holder;
(b) removing said second planar member;
(c) placing said alignment sheet on said surface and positioning said locator means on said projection means;
(d) removing said first planar member and placing another planar member on said holder;
(e) lowering said holder to place said other planar member upon said alignment sheet;
(f) directing electromagnetic radiation toward said registration patterns;
(g) moving said other planar member relative to said alignment sheet to alter the radiation rays passing through said registration patterns to a predetermined level;
(h) raising said holder;
(i) removing said alignment sheet;
(j) placing said second planar member on said surface and positioning said locator means on said projection means whereby said other planar member and second planar member are in registry.

9. The method of claim 5 wherein said surface is provided with means for enabing said first planar member to move in mutually perpendicular directions within an imaginary plane relative to said holder; and wherein step (e) further comprises selectively moving said first planar member and said mutually perpendicular directions to move the first registration pattern into alignment with said secnd registration pattern.

10. The method of claim 5 wherein said holder is provided with means for enabling said first planar means to be rotated and to move in mutually perpendicular directions within an imaginary plane relative to said holder said step (e) further comprising selectively rotating and moving the first planar member in mutually perpendicular directions to move the first registration pattern into registry with the second registration pattern.

11. The method of claim 10 wherein said holder is provided with means for rotably mounting said surface and step (e) further comprises selectively rotating said surface to bring said complementary registration patterns into registry.

12. The method of claim 5 further comprising the steps of:
raising said projection means prior to placing the alignment sheet on said surface; and
lower said projection means prior to lowering said holder and said first planar member upon said alignment sheet.

13. The method of claim 10 further comprising the step of moving a barrier between the surface and the holder whenever the projection means is raised to prevent the first planar member from engaging the locator projections.

14. The method of claim 5 wherein said first planar member comprises a printing screen and said method further comprises the steps of:
applying a liquid to said second planar member by placing the liquid upon said first planar member and moving a squeegee across said first planar member to urge said liquid through said printing screen and onto said second planar member in a pattern determined by the pattern in said printing screen.

15. Apparatus for bringing planar members into registry comprising:
support means having a surface for supporting one of said planar members;
holder means;
means movably mounting said holder means relative to said support means;
said holder means including clamping means for receiving and releasably securing one of said planar members;
means for moving said holder means and said support means relative to one another and in an imaginary plane substantially parallel to the surface of said support means;
the planar member supported on said holder having a first registration pattern;
electromagnetic radiation generation means for directing radiation upwardly through said surface;
projection means associated with said surface;
an alignment sheet for placement on said surface and having second registration means and locator means for positioning on said projection means to locate said alignment sheet on said surface with said second registration means positioned over said radiation generating means.

16. The apparatus of claim 15 wherein said generating means generates radiation in the visible spectrum.

17. The apparatus of claim 15 wherein the planar member positioned on said surface is provided with a second registration pattern for cooperating with said first registration pattern to facilitate registration therebetween.

18. The apparatus of claim 15 wherein the second registration pattern comprises a plurality of closely spaced openings arranged so that the portions of said sheet between said openings forms a predetermined configuration which prevents passage of said radiation; said first registration means forming a second configuration substantially identical to said first configuration, said second configuration arranged to pass said radiation therethrough, whereby said first and second registration patterns cooperate to substantially block the passage of electromagnetic radiation when said first and second configurations are aligned.

19. The apparatus of claim 15 further comprising means for extending the projection means upwardly through said surface responsive to raising of said holder above said surface and for lowering said projection means when responsive to lowering of said holder upon said surface.

20. The apparatus of claim 19 further comprising delay means for delaying the raising of said projection means until said holder is lifted by a predetermined distance above said surface.

21. The apparatus of claim 19 further comprising safety means responsive to said holder means for preventing the planar member on said holder from engaging said projection means.

22. The apparatus of claim 20 wherein the planar member positioned upon said surface is provided with locator means arranged to cooperate with said projection means to assure registration with the planar member mounted on said holder.

23. The apparatus of claim 18 wherein said holder is provided with means for moving a planar member on said holder in mutually perpendicular directions within an imaginary plane.

24. The apparatus of claim 23 wherein said moving means further comprises means for rotating the planar member on said holder about an imaginary axis arranged perpendicular to said imaginery plane.

25. The apparatus of claim 18 further comprising means for creating a pattern on the planar member supported on said surface in accordance with the pattern provided on said first planar member only when said holder has lowered to a predetermined position.

26. The apparatus of claim 18 wherein said projection means comprises a plurality of pins; pin operating means for raising said pins responsive to raising of said holder and for lowering said pins responsive to lowering of said holder.

27. The apparatus of claim 18 wherein said support means further comprises vacuum means for holding a member resting upon said surface responsive to lowering of said projection means.

28. The apparatus of claim 27 wherein said vacuum means comprises a shallow recess in the surface of said support means and a vacuum source communicating with said recess.

29. The apparatus of claim 26 further comprising delay means for preventing said pins from being raised until said holder has been raised at least a predetermined distance above said surface.

30. The apparatus of claim 25 wherein said pattern creating means comprises squeegee means for urging a liquid through said planar member mounted on said holder and onto the planar member supported on said surface.

31. The apparatus of claim 30 wherein the planar member mounted on said holder is a printing screen.

32. The apparatus of claim 25 wherein the planar member mounted on said holder comprises a mask; radiation generating means mounted on said holder for directing radiation towards said mask and the planar member mounted on said support means.

33. The apparatus of claim 26 further comprising pneumatic means for selectively operating said pin operating means and for moving said holder means.

34. The apparatus of claim 33 wherein said pneumatic means further comprises delay means for delaying the lifting of said pin means at least until said holder has been raised a predetermined distance above said surface.

35. The apparatus of claim 34 wherein said delay means comprises an enlarged chamber for diverting and accumulating air being delivered to the pneumatic means for lifting said holder and thereby delaying lowering of said holder relative to lowering of said pins.

36. The apparatus of claim 21 further comprising an elongated member coupled to said holder for moving a safety member between said holder and said support for preventing lowering of the planar member on said holder toward said surface until said projection means have lowered to a predetermined position.

37. The apparatus of claim 18 wherein the planar member mounted to said holder is a screen having a pattern for selectively transferring a liquid deposition on said screen upon the planar member positioned on said surface.

38. The apparatus of claim 37 wherein the first registration means on said screen permits the passage of radiation therethrough but prevents the ink deposited on said registration means from being transferred to the planar member positioned on said surface.

39. The apparatus of claim 21 wherein said safety means further comprises blocking means responsive to lifting of said pins for preventing lowering of said holder below a predetermined position to prevent the planar member on said holder from engaging said pins.

40. The apparatus of claim 39 wherein said blocking means comprises a member having a shoulder arranged a spaced distance above said surface and slidable means arranged on said holder and movable into the path of said shoulder responsive to lifting of said pins and movable out of the path of said holder responsive to lowering of said pins.

41. The apparatus of claim 30 further comprising switch means for preventing operation of said squeegee means unless said holder has been lowered to a predetermined level.

42. The apparatus of claim 30 further comprising means for selectively lowering and raising said squeegee means relative to the pattern creating means.

* * * * *